United States Patent [19]
Mori

[11] Patent Number: 5,864,152
[45] Date of Patent: *Jan. 26, 1999

[54] SEMICONDUCTOR MEMORY AND METHOD OF WRITING, READING, AND SUSTAINING DATA

[75] Inventor: Toshihiko Mori, Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 637,182

[22] Filed: Apr. 24, 1996

[30] Foreign Application Priority Data

Apr. 26, 1995 [JP] Japan ................................ 7-102519
Mar. 19, 1996 [JP] Japan ................................ 8-062777

[51] Int. Cl.$^6$ .................. H01L 29/201; H01L 29/737; G11C 11/40
[52] U.S. Cl. .................. 257/198; 257/201; 257/105; 365/180
[58] Field of Search .................. 257/104, 105, 257/197, 198, 201, 109, 163, 164; 365/179, 180

[56] References Cited

U.S. PATENT DOCUMENTS

| 5,311,465 | 5/1994 | Mori et al. | 365/179 |
| 5,438,539 | 8/1995 | Mori | 257/197 |
| 5,561,306 | 10/1996 | Imamura et al. | 257/197 |
| 5,574,683 | 11/1996 | Mori | 365/179 |

FOREIGN PATENT DOCUMENTS 5-234361  9/1993  Japan .

*Primary Examiner*—Gene M. Munson
*Attorney, Agent, or Firm*—Nikaido, Marmelstein, Murray & Oram LLP

[57] ABSTRACT

A semiconductor memory has bit lines, word lines, ground lines, and memory cells. The bit lines intersect the word and ground lines, to form intersections where the memory cells are arranged, respectively. Each of the memory cells consists of a double-emitter transistor. This transistor has a collector, a first emitter, and a second emitter. Each base-emitter junction of the transistor has an N-shaped negative differential current-voltage characteristic that shows a relatively small gain up to a peak current and a relatively large gain after a valley current. The first emitter of each transistor is connected to a corresponding one of the ground lines. The second emitter is connected to a corresponding one of the word lines. The collector is connected to a corresponding one of the bit lines. Each of the memory cells has a small number of elements and requires only a small area.

26 Claims, 39 Drawing Sheets

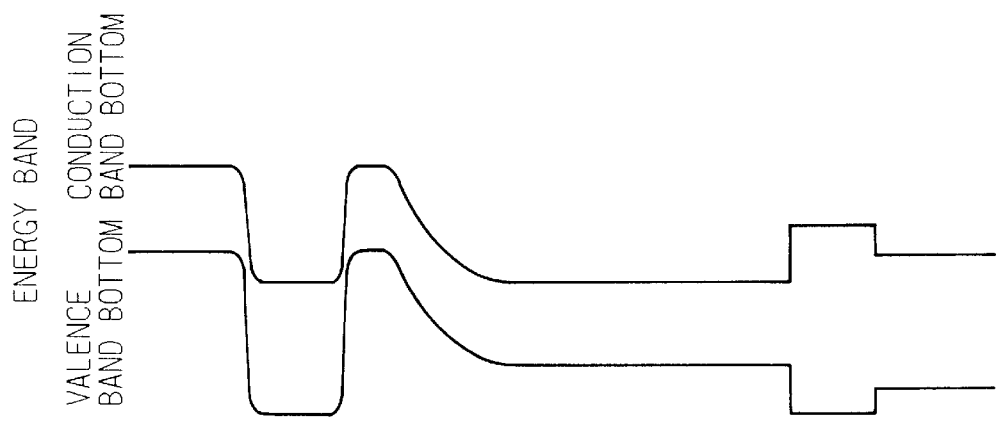
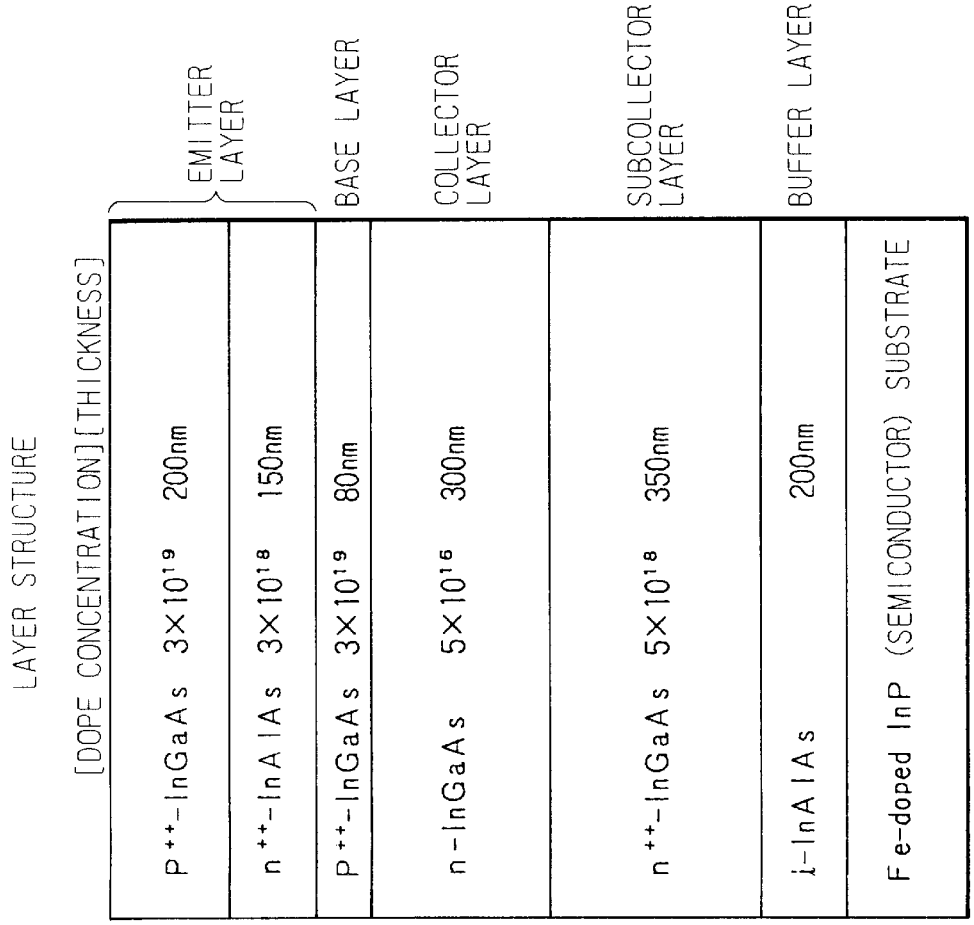

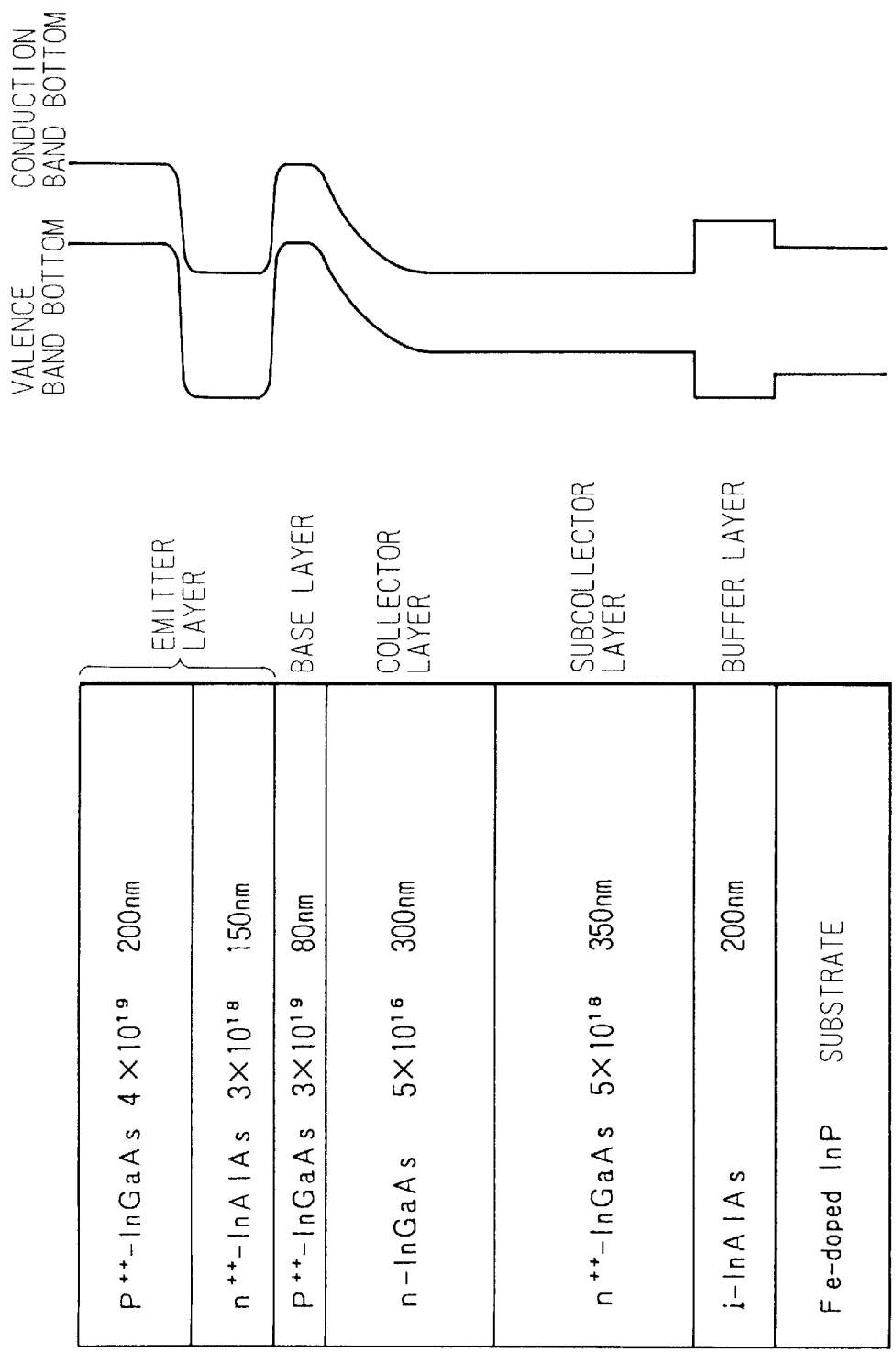

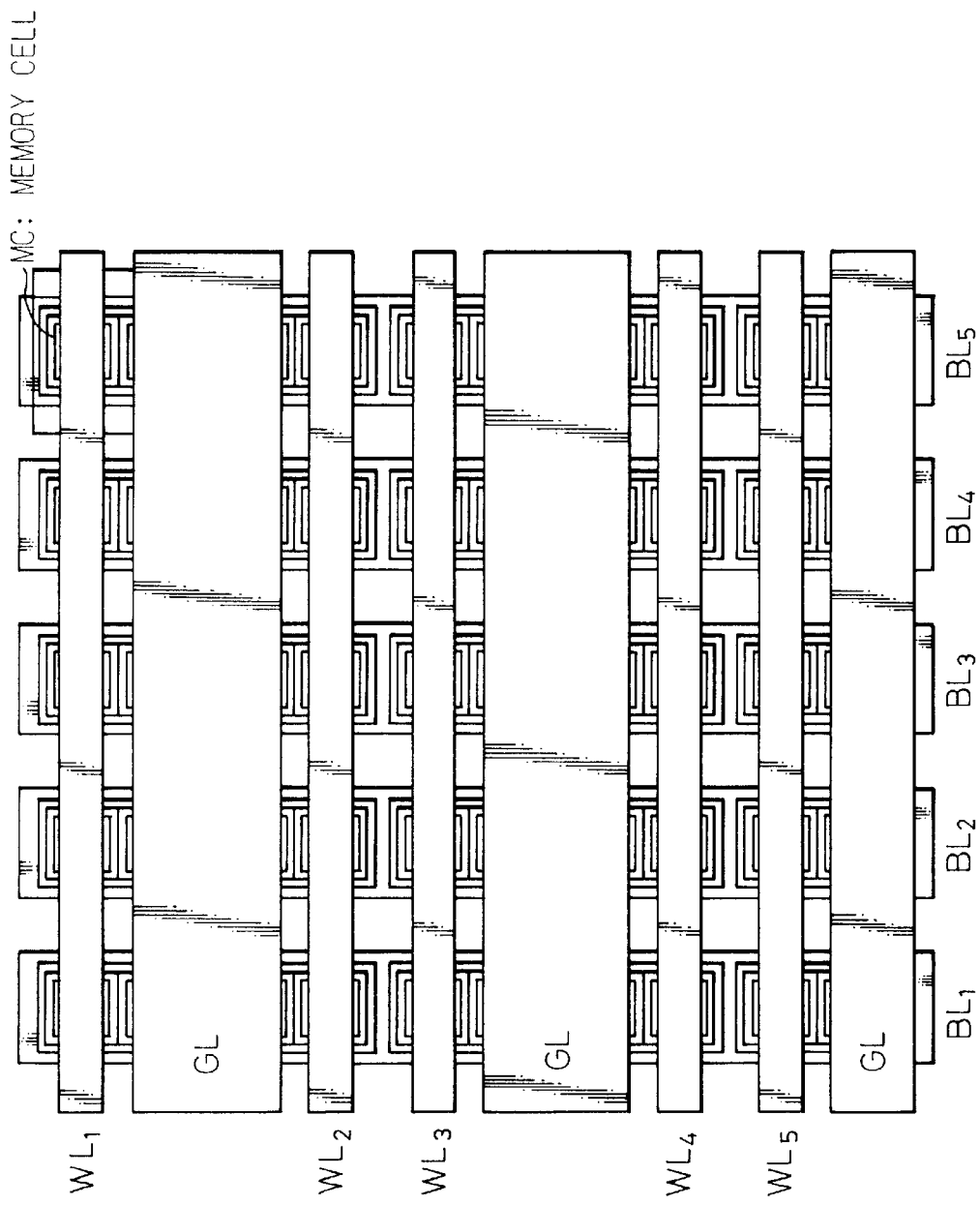

n⁺p⁺ JUNCTION (ESAKI DIODE) CHARACTERISTICS p⁺n⁺p⁺ JUNCTION CHARACTERISTICS

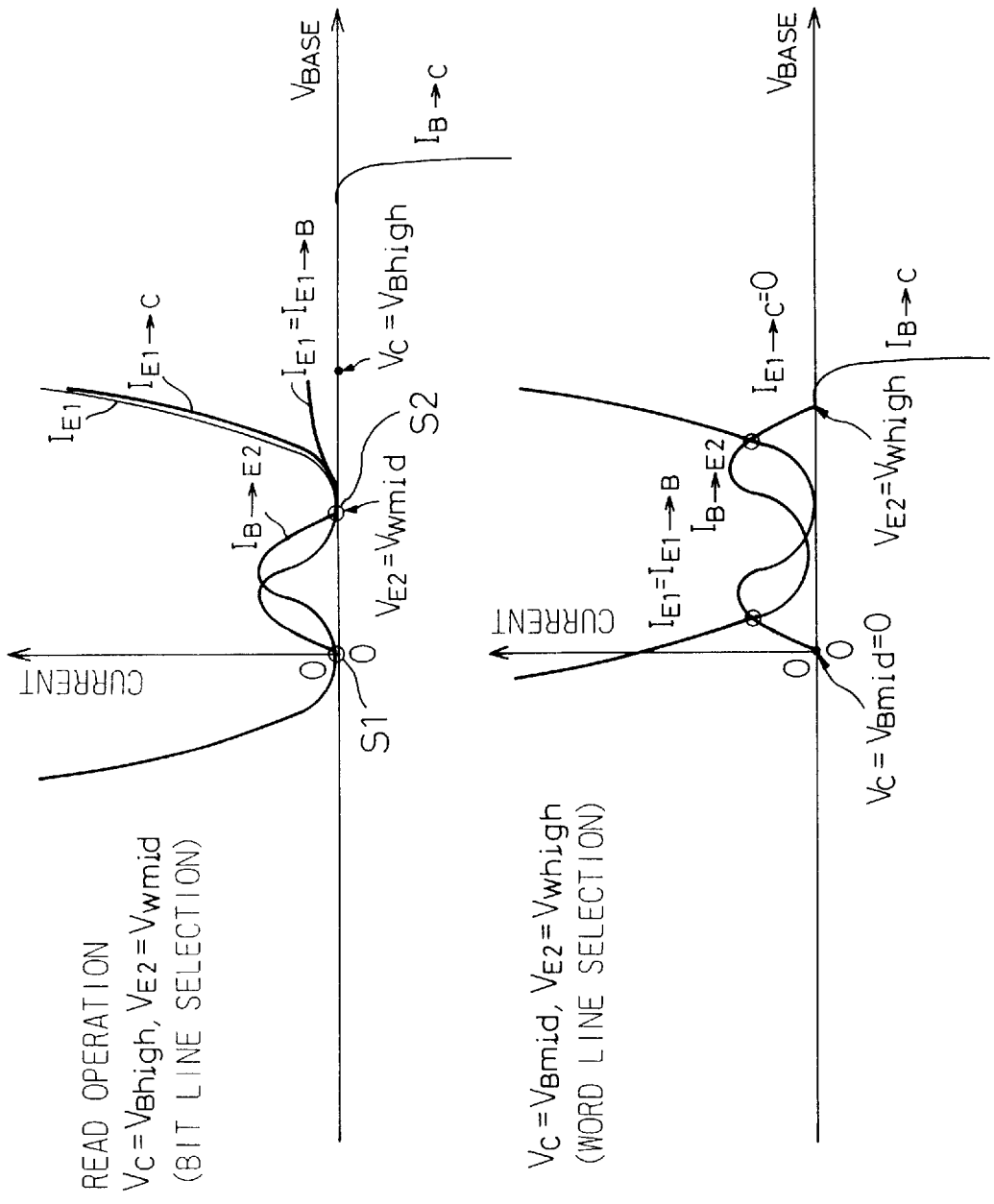

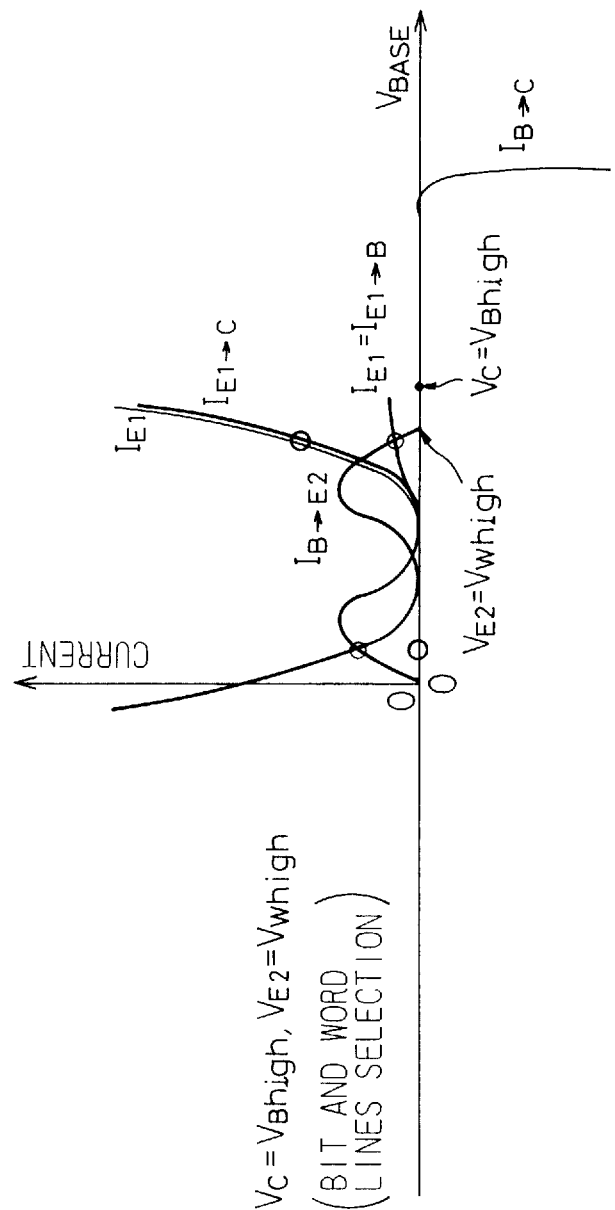

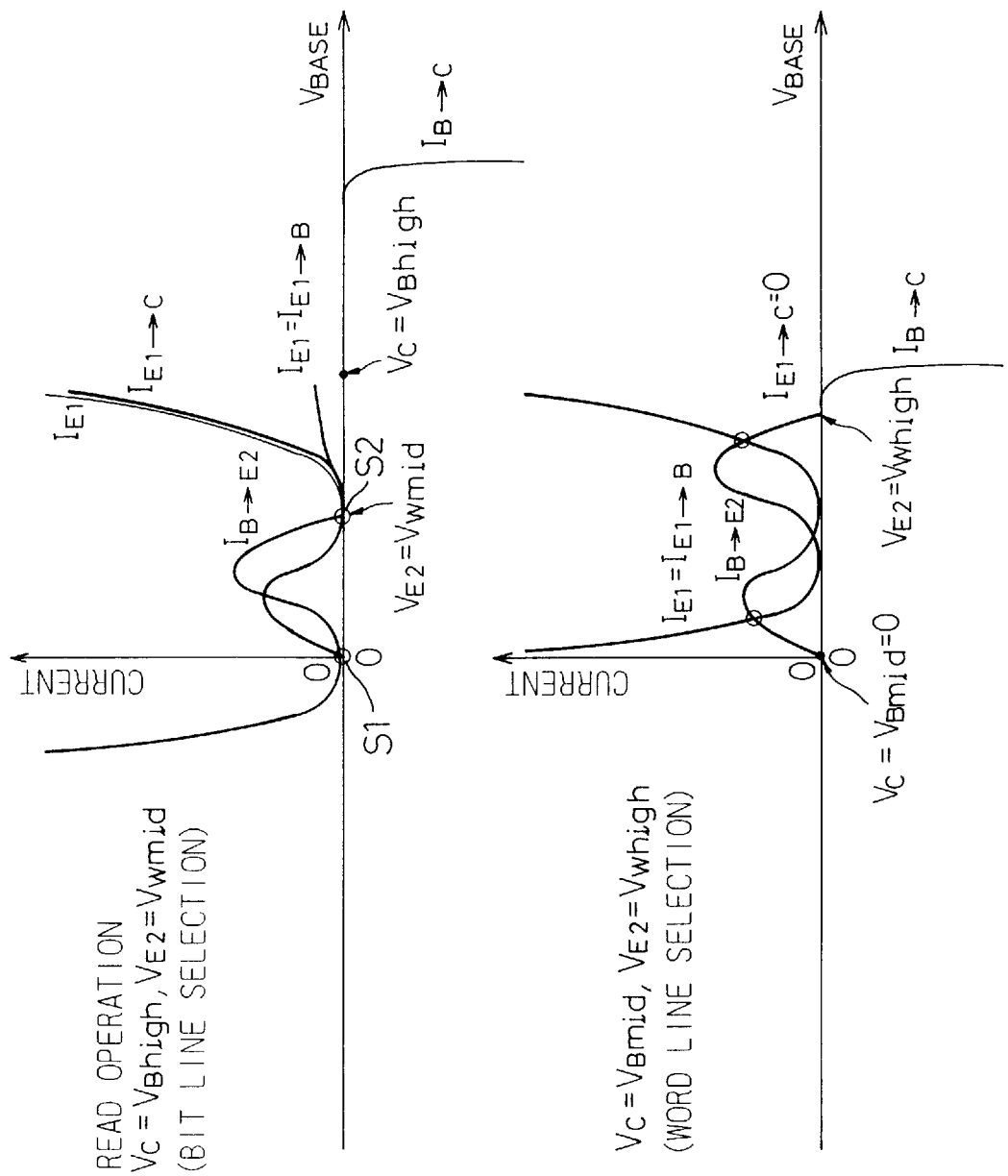

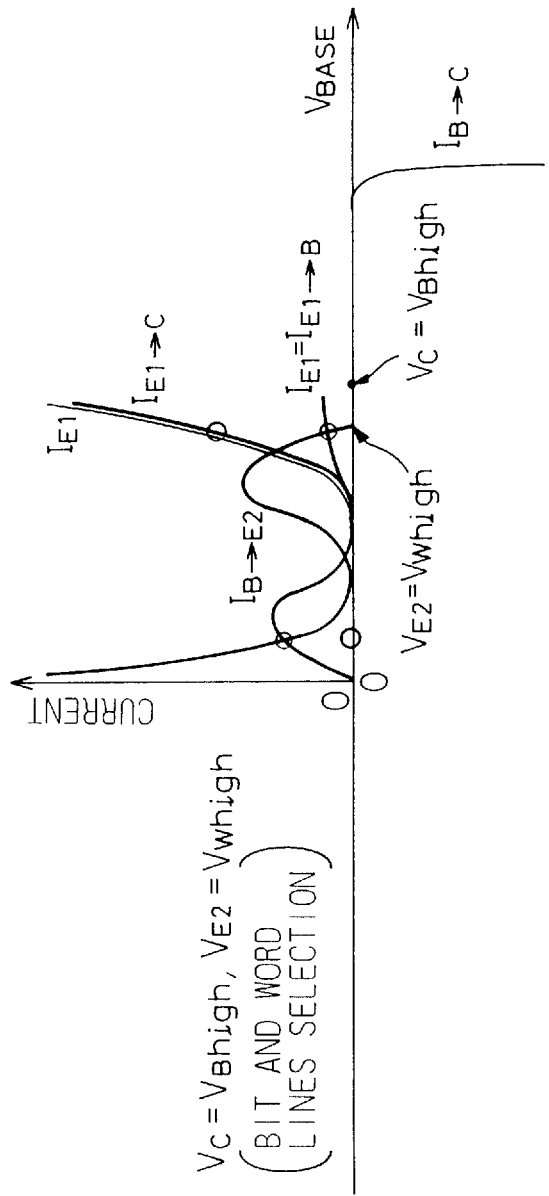

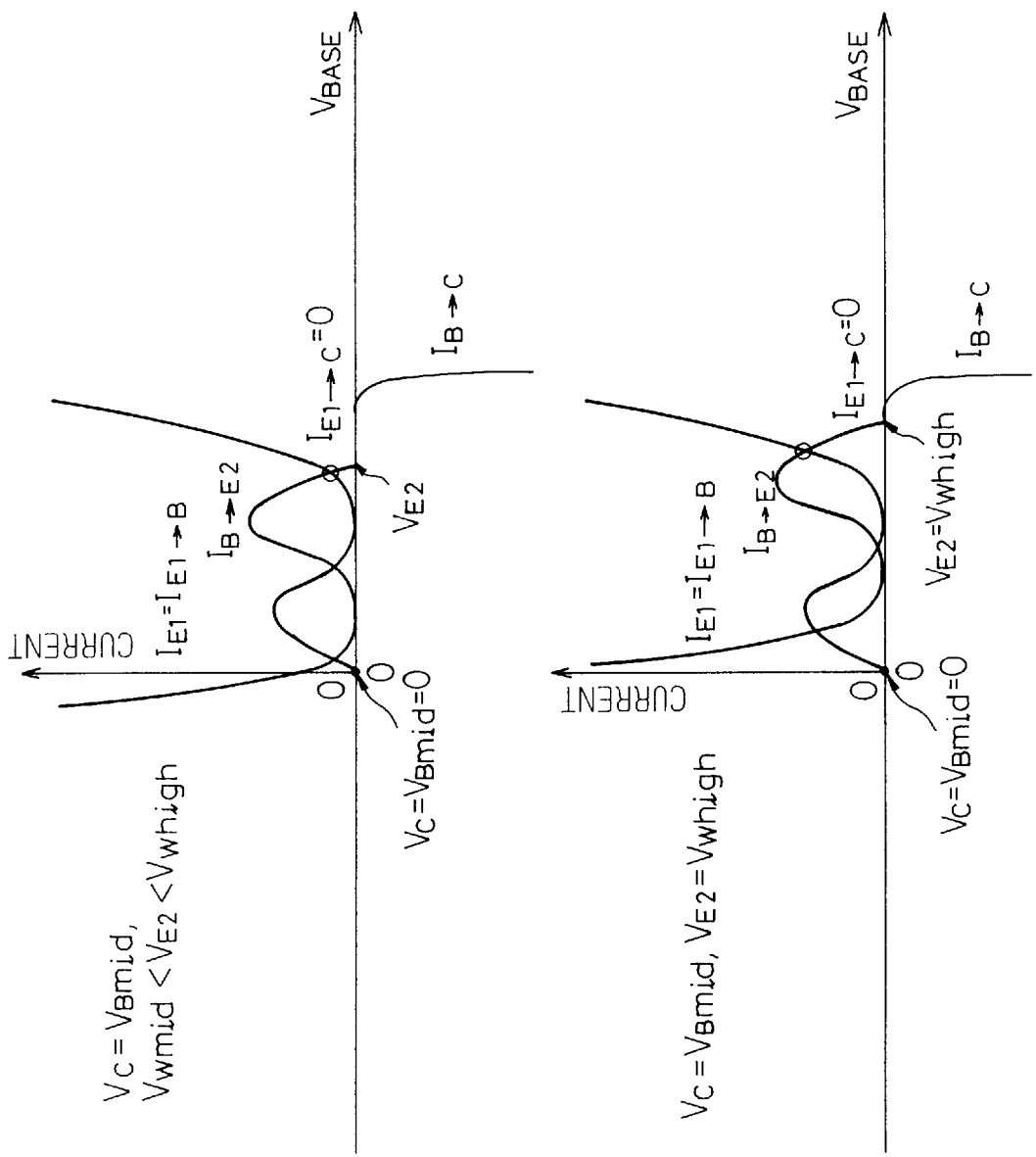

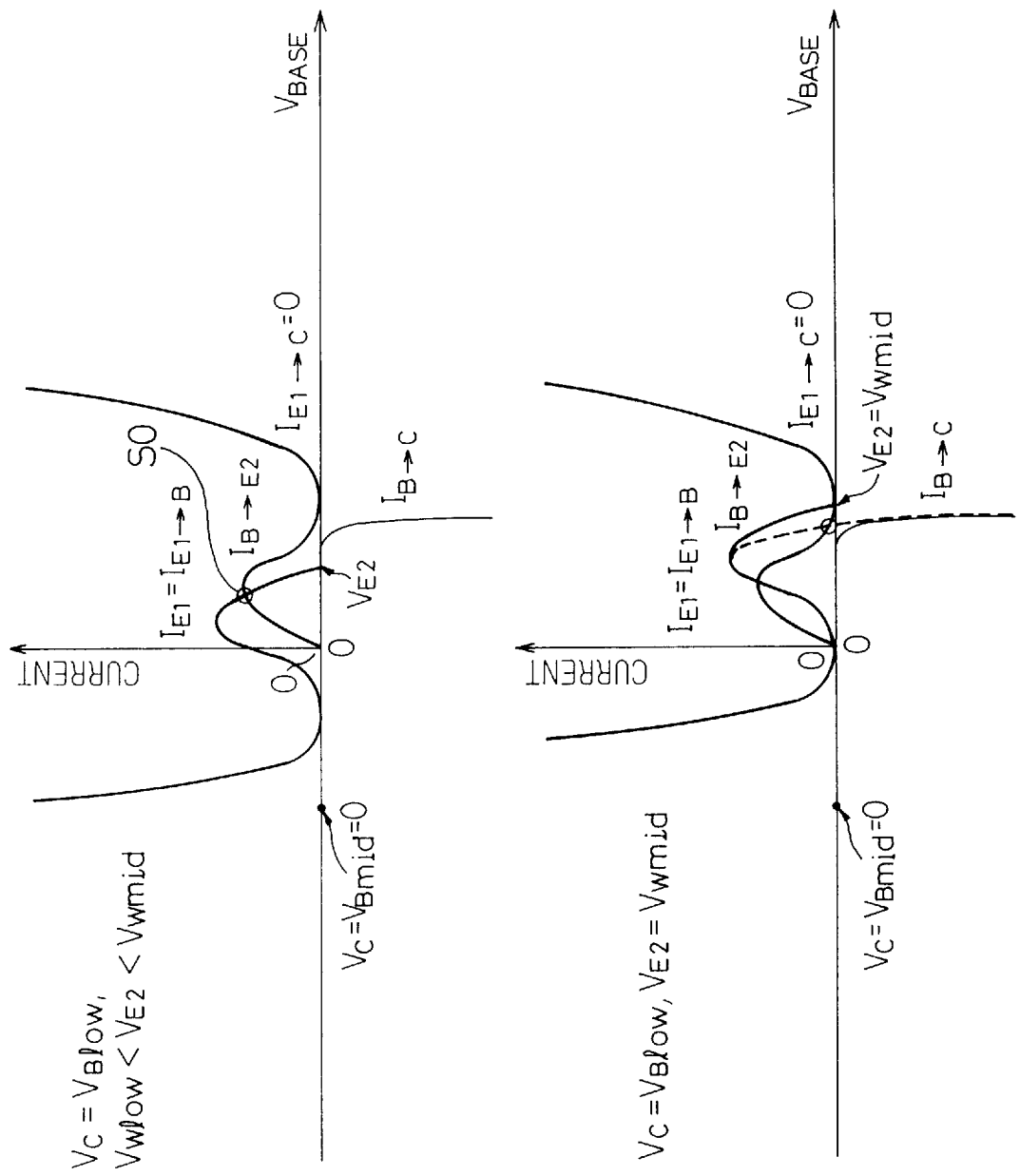

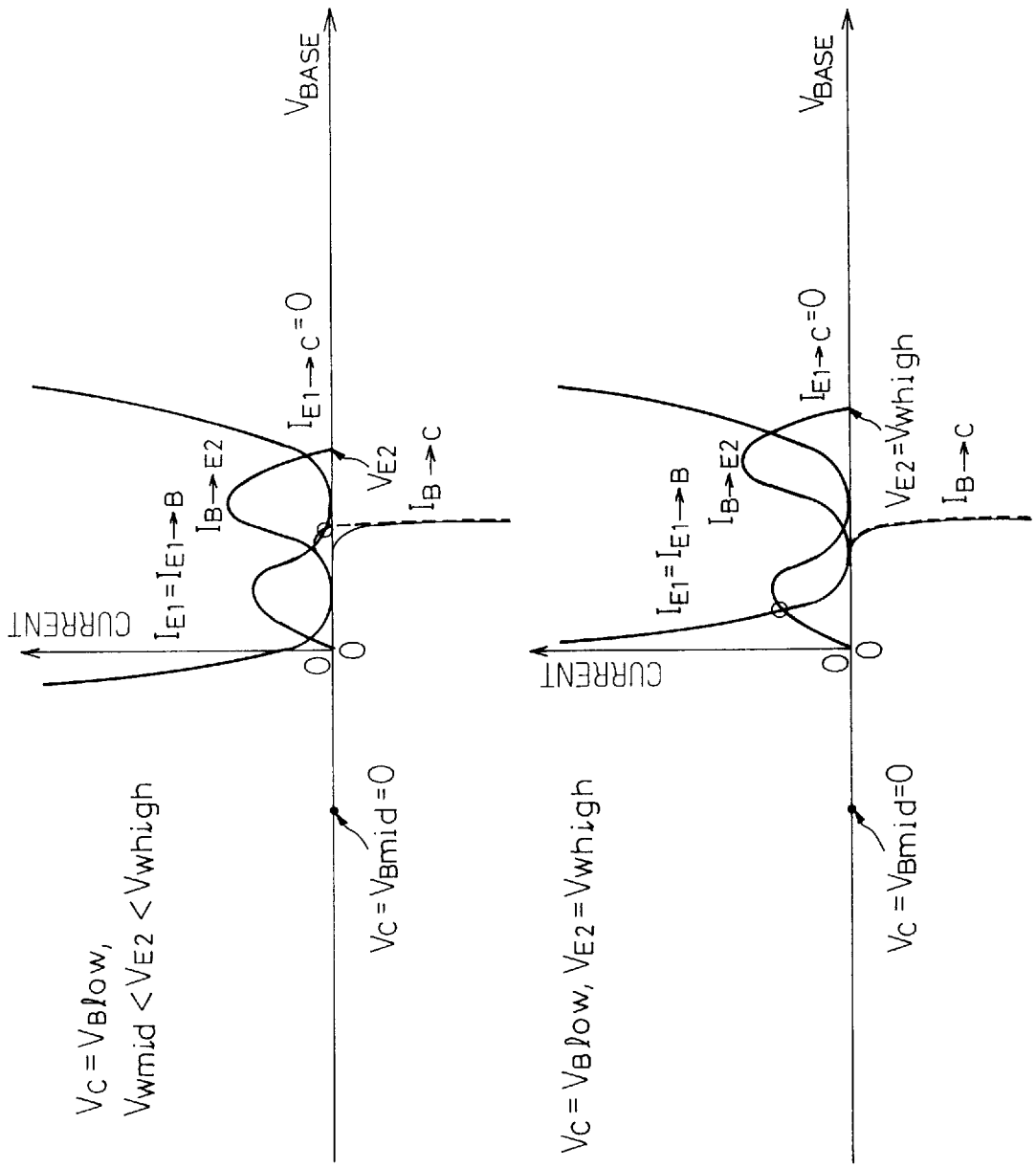

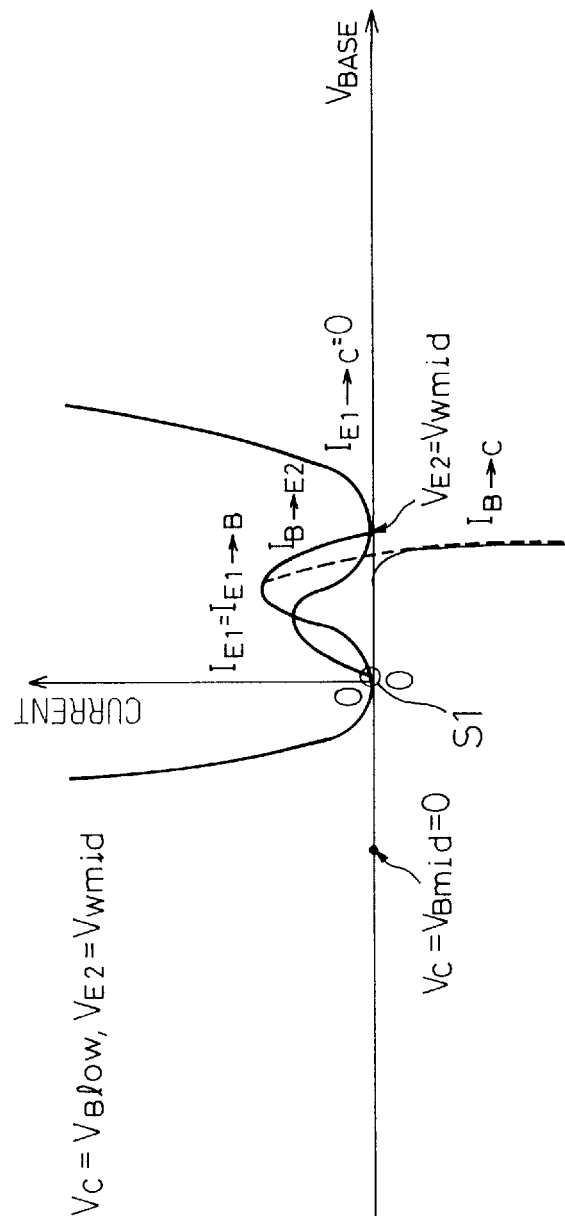

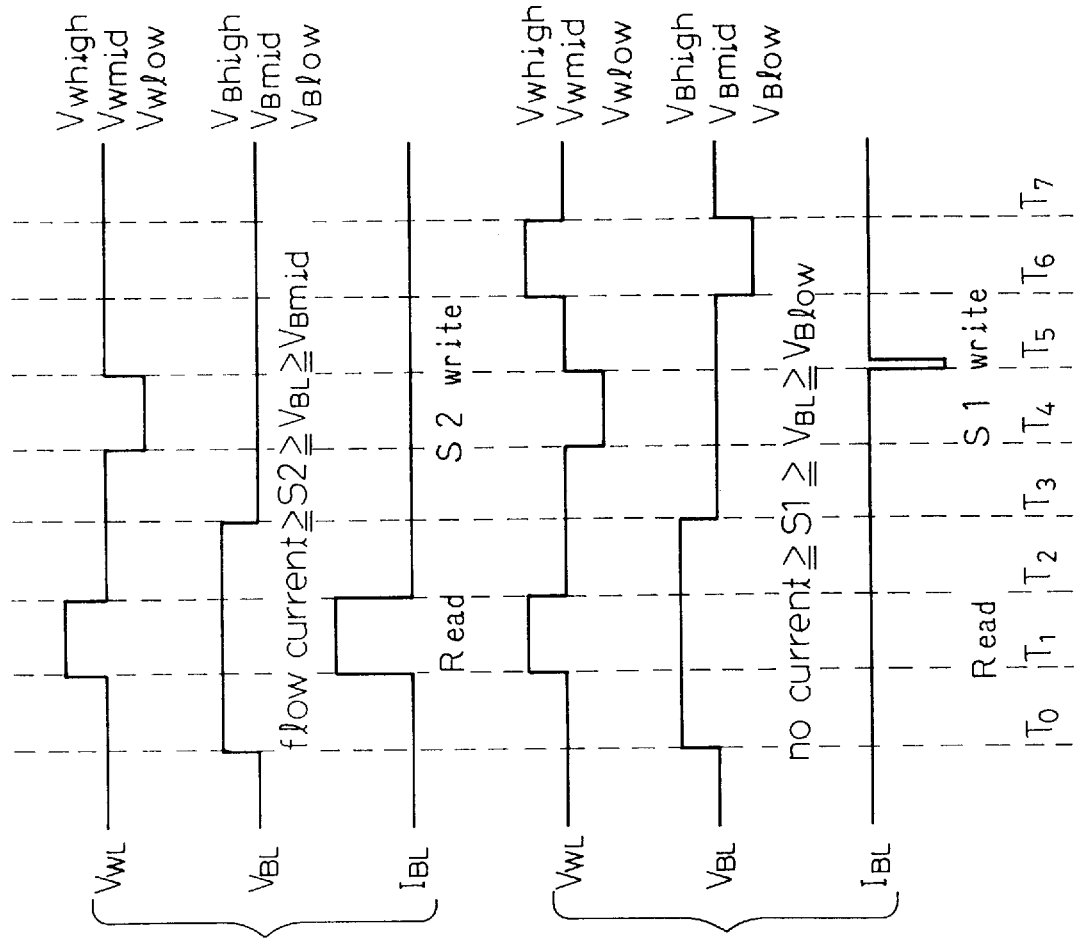

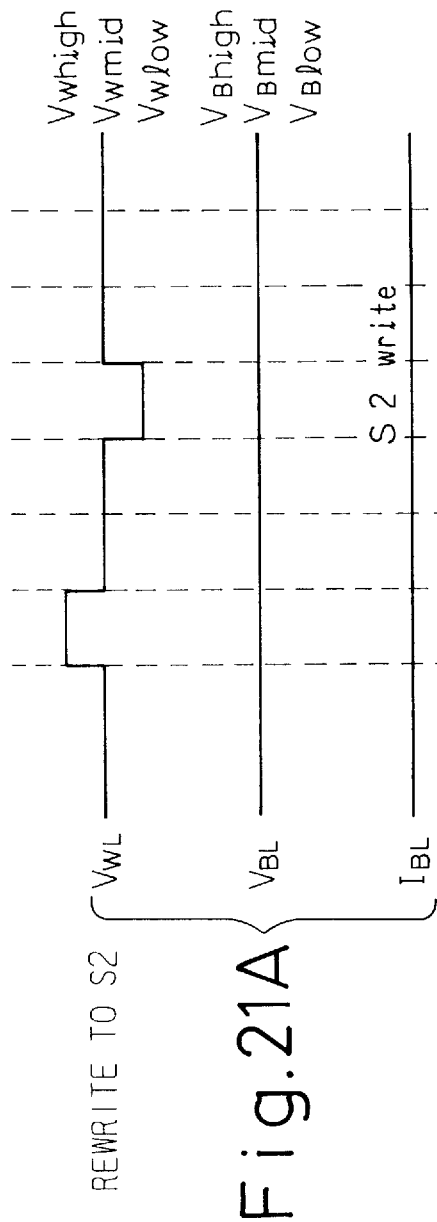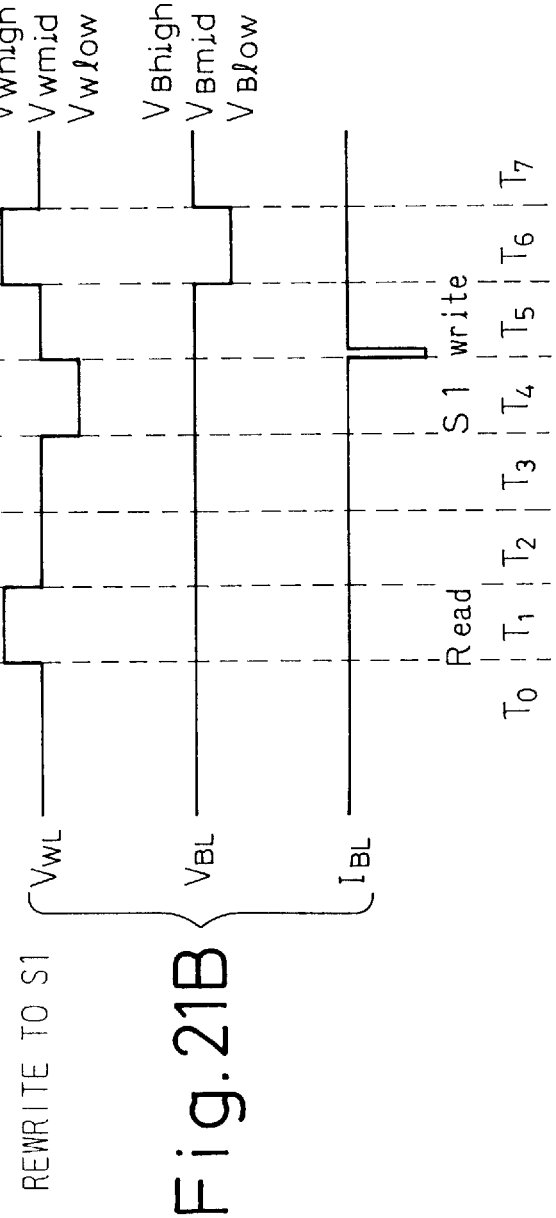

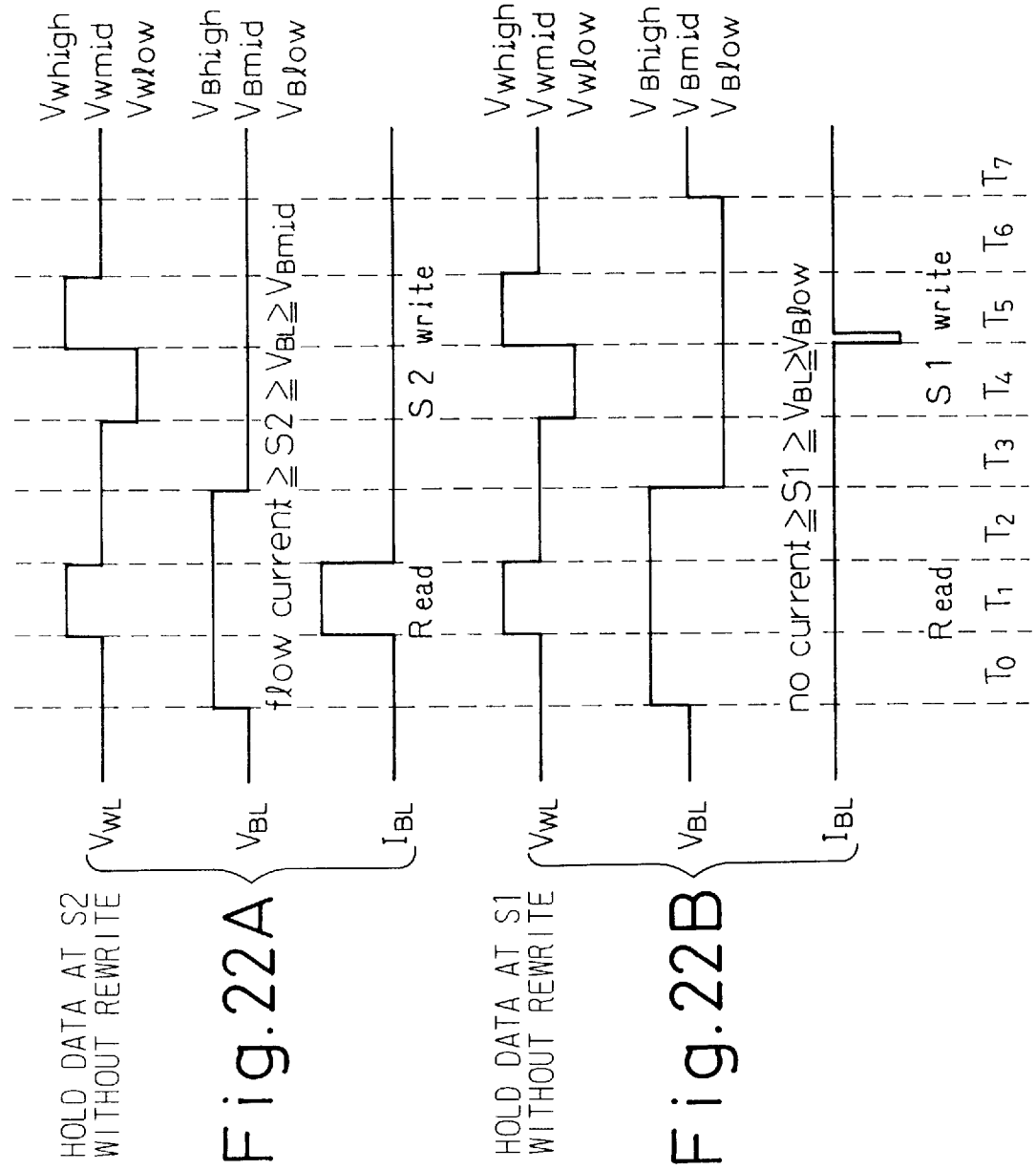

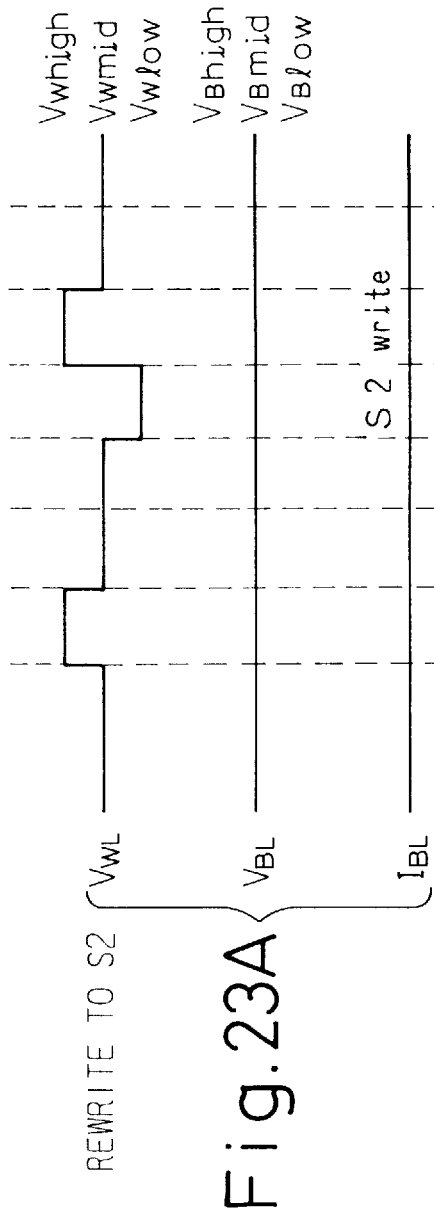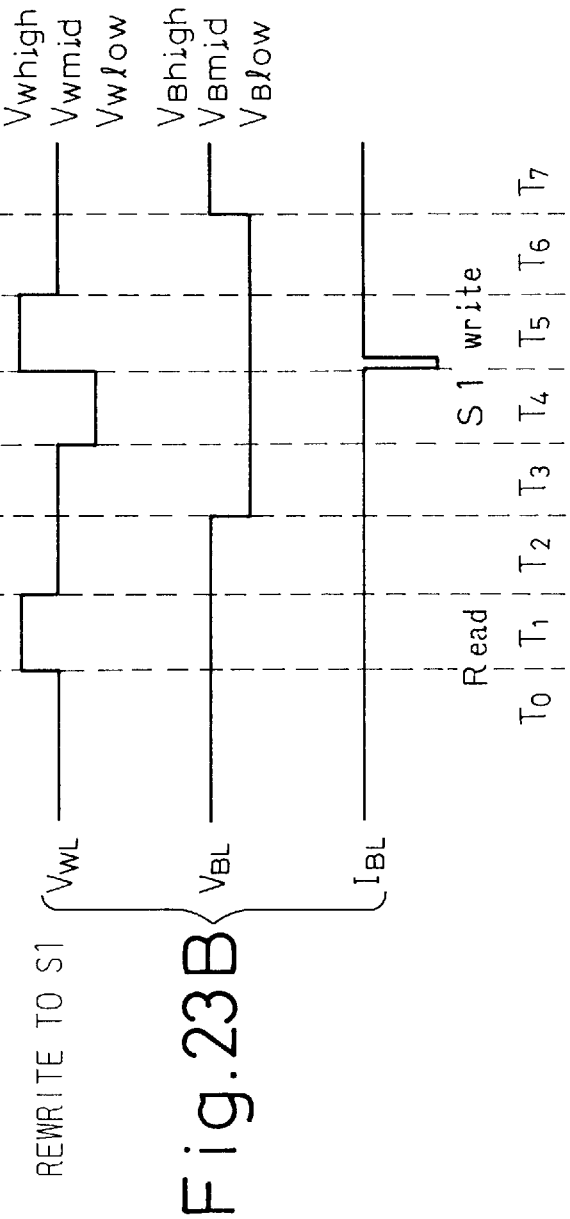

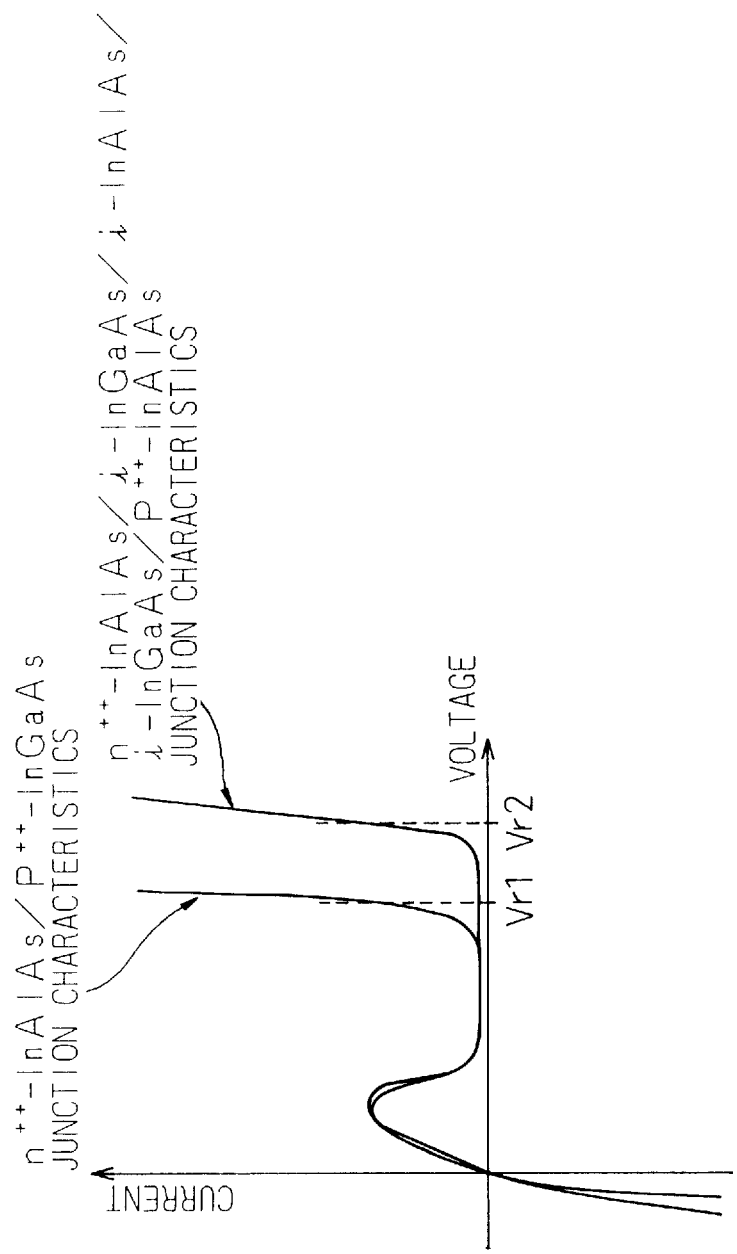

SEMICONDUCTOR MEMORY AND METHOD OF WRITING, READING, AND SUSTAINING DATA

BACKGROUND OF THE INVENTION

1. Field of the Invention

The present invention relates to semiconductor memories such as SRAMs (static random access memories) and a method of writing, reading, and sustaining data to, from, and in a semiconductor memory having memory cells each made of a resonance-tunnel-hot-electron transistor or a heterojunction bipolar transistor having a negative differential characteristic and a threshold characteristic.

2. Description of the Related Art

Large-scale semiconductor memories such as 256-Mbit DRAMs (dynamic random access memories) and 64-Mbit SRAMs are being developed. Conventional memory cell structures are incapable of realizing higher density memories. It is required, therefore, to provide semiconductor memory cells suitable for forming high-density memories as well as a method of stably driving such memory cells.

Each memory cell of a DRAM usually consists of a capacitor for storing data and an FET (field effect transistor) for writing and reading data to and from the capacitor. The capacitor is formed by using the junction capacitance of an FET.

An SRAM employs flip-flop memory cells each consisting of six FETs. This SRAM cannot be minimized because each memory cell needs an area for the six FETs.

Japanese Unexamined Patent Publication (Kokai) Nos. 5-234361 and 5-235291 disclose examples of a semiconductor memory employing memory cells each being small and consisting of a small number of elements, and a method of writing and reading data to and from such memory cells.

These disclosures form each memory cell from a double-emitter transistor, which has two base-emitter junctions each having a negative differential characteristic to provide a bistable state. Data "1" and "0" are allocated to the two stable states, respectively. The bistable state is not changed even when voltages are separately applied to a bit line, word line, and ground line connected to the memory cell. When the memory cell holds data, no current flows through a base-collector junction having a threshold characteristic.

When given voltages are simultaneously applied to the bit and word (ground) lines of a given memory cell, a current flows through the base-collector junction of the memory cell depending on one of the data storage states, or the data storage states are switched from one to another. Namely, it is possible to write and read data to and from a selected memory cell.

In this way, forming each memory cell with a double-emitter transistor realizes a high-integration SRAM.

To read a memory cell of the SRAM, a current flowing through a corresponding bit line is sensed. This current must be below a peak current to avoid a destructive read operation. Namely, this current determines a memory reading speed. On the other hand, the power consumption of each memory cell is determined by a valley current. Accordingly, the product of speed and power consumption of a memory cell is determined by the peak-valley ratio of a resonance tunnel of the memory cell.

To write data to a memory cell of the SRAM, a potential difference exceeding the forward and reverse breakdown voltages of the memory cell must be applied to the collector and emitters thereof. In this regard, the lower the breakdown voltages, the better. The breakdown voltages, however, must be high when the memory cells are arranged adjacent to one another.

The multiemitter resonance tunnel hot electron transistor (ME-RHET) serving as a memory cell of the SRAM of the prior arts mentioned above must be operated at a low temperature to achieve maximum performance.

On the other hand, a bipolar transistor such as a heterojunction bipolar transistor (HBT) having the same characteristics as the ME-RHET may operate at a room temperature. An example of the HBT is an RBT whose base-emitter junction has a negative differential characteristic. The negative differential characteristic of the RBT, however, is not symmetrical in forward and reverse directions. The symmetry is imperative to form an SRAM.

In the case of the ME-RHET, each base-emitter junction thereof is conductive with forward and reverse biases. Accordingly, an emitter biased to a higher potential among the two emitters of the ME-RHET serves as a base to draw electrons that lose energy due to dispersion in the base of the transistor. On the other hand, the base-emitter junction of the bipolar transistor is not conductive under a reverse bias. To solve this problem, a multiemitter HBT having a high-concentration emitter to draw electrons through a zener tunnel has been proposed. This transistor, however, does not provide a high P/V ratio because its resonance tunnel barrier is buried in a high-concentration-doped area.

The problem in the prior art will be explained later in detail, with reference to the accompanying drawings.

SUMMARY OF THE INVENTION

An object of the present invention is to provide a semiconductor memory employing memory cells that are small and consist of a small number of elements, and a method of writing, reading, and sustaining data to, from, and at each memory cell of such semiconductor memory.

Another object of the present invention is to provide a semiconductor memory employing memory cells that are small and consist of a small number of elements that work at a room temperature, and a method of writing, reading, and sustaining data to, from, and in each memory cell of such a semiconductor memory.

According to the present invention, there is provided a semiconductor memory having a bit line, a word line, a ground line, and a memory cell, the bit line intersecting the word and ground lines to form an intersection where the memory cell is arranged, the memory cell comprising a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line.

The transistor may be a multiemitter Esaki tunnel heterojunction transistor made of a high-concentration-dope heterojunction bipolar transistor and a second emitter layer formed on a first emitter layer of the bipolar transistor, the second emitter layer having a different conduction type from the first emitter layer and being doped at high concentration. The first emitter layer may be made of n-type InAlAs, and the second emitter layer is made of p-type InGaAs.

The negative differential characteristics of the transistor may be designed such that a forward peak current of the first emitter is smaller than a reverse peak current of the second emitter. The area of the emitter-base junction of the first emitter may be smaller than the area of the emitter-base junction of the second emitter. The dope concentration of the second emitter layer may be high when the second emitter layer is of a p-type and may be low when the same is of an n-type.

The transistor may have an N-shaped negative differential current-voltage characteristic where a voltage rise after a reverse valley of the second emitter may be higher than a voltage rise after a forward valley of the first emitter. The transistor may be constituted such that a band gap of the second emitter layer is larger than a band gap of a base layer. The transistor may be constituted such that a resonance level construction layer is inserted between the first emitter layer and the second emitter layer, so that a peak current density may be maintained high by using the resonance tunneling effect of the resonance level construction layer. The resonance level construction layer may be made of non-doped InGaAs/InAlAs/InGaAs, the first emitter layer may be made of n-type InAlAs, the second emitter layer may be made of p-type InAlAs, and a base layer formed under the first emitter layer may be made of p-type InGaAs.

The memory cell may be arranged between the intersections of the bit line, word line, and ground line with the word and ground lines being in parallel with each other and orthogonal to the bit line.

According to the present invention, there is also provided a semiconductor memory having bit lines, word lines, ground lines, and memory cells, the bit lines intersecting the word and ground lines to form intersections where the memory cells are arranged, wherein the semiconductor memory further comprises a bit line address decoder for supplying an address signal to the bit lines; a word line address decoder for supplying an address signal to the word lines; and a sense circuit for detecting data stored in the memory cells through the bit lines.

The word lines and ground lines may be alternated one by one. The word lines and ground lines may be alternated two by two. Every two adjacent ground lines may be integrated into one.

Further, according to the present invention, there is provided a method of sustaining data in a memory cell of a semiconductor memory of, the semiconductor memory having a bit line, a word line, a ground line, and a memory cell, the bit line intersecting the word and ground lines to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line, the memory cell having the first and second base-emitter junctions that form, with the base layer, the series circuits to provide the two stable operation points, the method comprising the steps of applying a potential, which biases the transistor to the valleys of the N-shaped negative differential characteristics, to one of the first and second emitters; and applying a potential to the bit line, the potential being sufficiently low not to provide a gain with respect to a ground level and higher than a reverse breakdown voltage of the base-collector junction of the transistor.

The potential applied to the bit line may be at a ground level.

According to the present invention, there is also provided a method of sustaining data in a memory cell of a semiconductor memory, the semiconductor memory having a bit line, a word line, a ground line, and a memory cell, the bit line intersecting the word and ground lines, to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points, wherein the method comprises the steps of applying a potential, which biases the transistor to the valleys of the N-shaped negative differential characteristics, to one of the first and second emitters; and applying a potential to the bit line, the potential being sufficiently low not to provide a gain with respect to a ground level and higher than a reverse breakdown voltage of the base-collector junction of the transistor.

The potential applied to the bit line may be at a ground level. The number of memory cells connected to a given word line may be smaller than the number of bits to which data is written, data stored in memory cells to which no data is written may be once read, and the read data may be again written to the memory cells at write timing.

Further, according to the present invention, there is also provided a method of reading data out of a memory cell of a semiconductor memory, the semiconductor memory having a bit line, a word line, a ground line, and a memory cell, the bit line intersecting the word and ground lines, to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points, the method comprising the steps of applying a potential to the bit line so that the transistor of the memory cell provides a sufficient gain, the first stable operation point involving a low base potential provides a low gain and the second stable operation point involving a high base potential provides a high gain; and applying a potential to the word line, the potential being higher than a sustain potential and sufficiently low not to destruct the data stored in the memory cell, and detecting a current passing through the bit line, to read the data.

A potential of the bit line may be increased to a first voltage in order to obtain a sufficient gain from the transistor, and then a potential of the word line may be increased to a second voltage higher than the sustain voltage when starting the reading operation of the memory cell, and the potential of the word line may be decreased, and then the potential of the bit line may be decreased when completing the reading operation of the memory cell.

In addition, according to the present invention, there is also provided a method of writing data to a memory cell of a semiconductor memory, the semiconductor memory having a bit line, a word line, a ground line, and a memory cell, the bit line intersecting the word and ground lines, to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, the method comprising the steps of applying a potential, which is lower than a sustain potential, to the bit line of the memory cell, applying a high potential to the word line, to destruct the two stable operation points, and again applying the sustain potential to the word line, to thereby write data at a first stable operation point involving the low base potential of the two stable operation points of the memory cell when the data must be written to the first operation point; and maintaining the sustain potential to the bit line of the memory cell, applying a low potential to the word line, to destruct the two stable operation points, and again applying the sustain potential to the word line, to thereby write data at a second stable operation point involving the high base potential of the two stable operation points of the memory cell when the data must be written to the second operation point.

Further, according to the present invention, there is provided a method of writing data to an array of memory cells of a semiconductor memory, the semiconductor memory having a bit line, a word line, a ground line, and a memory cell, the bit line intersecting the word and ground lines to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, each memory cell having the first and second base-emitter junctions that form, with the base layer, the series circuits to provide the two stable operation points involving low and high base potentials, respectively, the method comprising the steps of maintaining a sustain potential to the bit line, applying a low potential to a given word line to destruct the two stable operation points of each memory cell connected to the word line, applying a sustain potential to the word line, to thereby write data at a second stable operation point involving the high base potential of the two stable operation points of each memory cell connected to the word line; applying a potential, which is lower than the sustain potential, to bit lines connected to memory cells to which data has been written at the second operation point and to which data must be written at a first operation point involving the low base potential of the two stable operation points; and applying a potential to the given word line to destruct the two stable operation points and applying the sustain potential to the word line, to write the data to the memory cells.

Further, according to the present invention, there is also provided a method of writing data to a memory cell of a semiconductor memory, the semiconductor memory having a bit line, a word line, a ground line, and a memory cell, the bit line intersecting the word and ground lines, to form an intersection where the memory cell is arranged, and the memory cell comprises a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, the method comprising the steps of applying a potential, which is lower than a sustain potential, to the bit line when writing data at a first stable operation point involving the low base potential of the two stable operation points; applying a sustain potential to the bit line when writing data at a second stable operation point involving the high base potential of the two stable operation points; and applying a potential, which is sufficiently low to destruct the two stable operation points, to the word line, applying a potential, which is higher than the sustain potential, to the word line, and again applying the sustain potential to the word line, to thereby write the data to the memory cell.

The number of memory cells connected to a given word line may be smaller than the number of bits to which data is written, data stored in memory cells to which no data is written may be once read, and the read data may be again written to the memory cells at write timing.

BRIEF DESCRIPTION OF THE DRAWINGS

The present invention will be more clearly understood from the description of the preferred embodiments as set forth below with reference to the accompanying drawings, wherein:

FIG. 3A shows the layer structure of a memory cell of a semiconductor memory according to a first embodiment of the present invention;

FIG. 3B shows the energy band of the structure of FIG. 3A;

FIG. 4A shows the layer structure of a memory cell of a semiconductor memory according to a second embodiment of the present invention;

FIG. 4B shows the energy band of the structure of FIG. 4A;

FIG. 11 is a plan view showing the SRAM of FIG. 10;

FIGS. 14A to 14C explains a read operation of a memory cell of a semiconductor memory according to the present invention;

FIGS. 17A to 17C explain a read operation of a memory cell of a semiconductor memory according to the present invention;

FIGS. 18A to 18G explain a write operation of a memory cell of a semiconductor memory according to the present invention;

FIGS. 19A to 19G explain another write operation of the memory cell according to the present invention;

FIGS. 20A and 20B explain the operation of a memory cell of a semiconductor memory according to the present invention that is not rewritten;

FIGS. 21A and 21B explain the operation of a memory cell of a semiconductor memory according to the present invention that is rewritten;

FIGS. 22A and 22B explain the operation of a memory cell of a semiconductor memory according to the present invention that is not rewritten;

FIGS. 23A and 23B explain the operation of a memory cell of a semiconductor memory according to the present invention that is rewritten;

FIG. 27 shows junction characteristics of the memory cell of FIGS. 26A and 26B;

DESCRIPTION OF THE PREFERRED EMBODIMENTS

Semiconductor memories and methods of writing, reading, and sustaining data to, from, and at the semiconductor memories according to the embodiments of the present invention will be explained.

Figure 1:
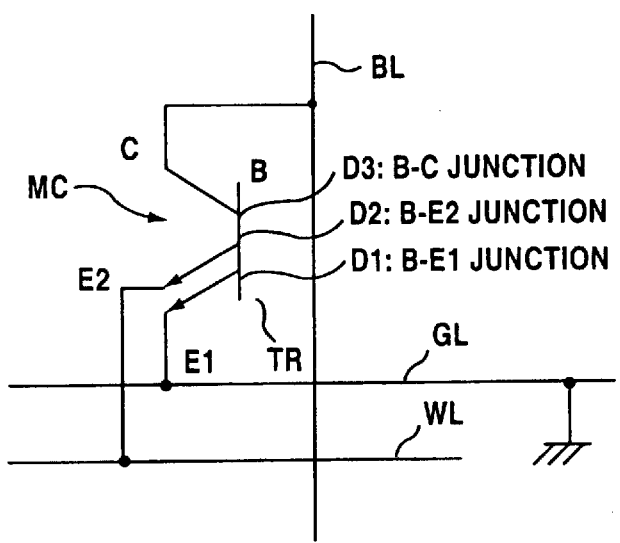
FIG. 1 shows an equivalent circuit of a memory cell of a semiconductor memory according to the present invention.

FIG. 1 shows an equivalent circuit of a memory cell of a semiconductor memory according to an embodiment of the present invention. The memory cell MC has a bit line BL, a word line WL, and a ground line GL.

The bit line BL intersects the word line WL and ground line GL, to form an intersection where the memory cell MC is arranged. The memory cell MC is made of a double-emitter transistor Tr having a collector C, a first emitter E1, and a second emitter E2. The base-emitter junctions of the transistor have each an N-shaped negative differential current-voltage characteristic, which shows a relatively small gain up to a peak current and a relatively large gain after a valley current.

More precisely, the transistor Tr is a multiemitter Esaki tunnel heterojunction bipolar transistor (ME-EHBT). The first emitter E1 is connected to the ground line GL, the second emitter E2 to the word line WL, and the collector C to the bit line BL. The base B and first emitter E1 of the transistor Tr form the junction D1, the base B and second emitter E2 form the junction D2, and the base B and collector C form a junction D3.

Figure 2:
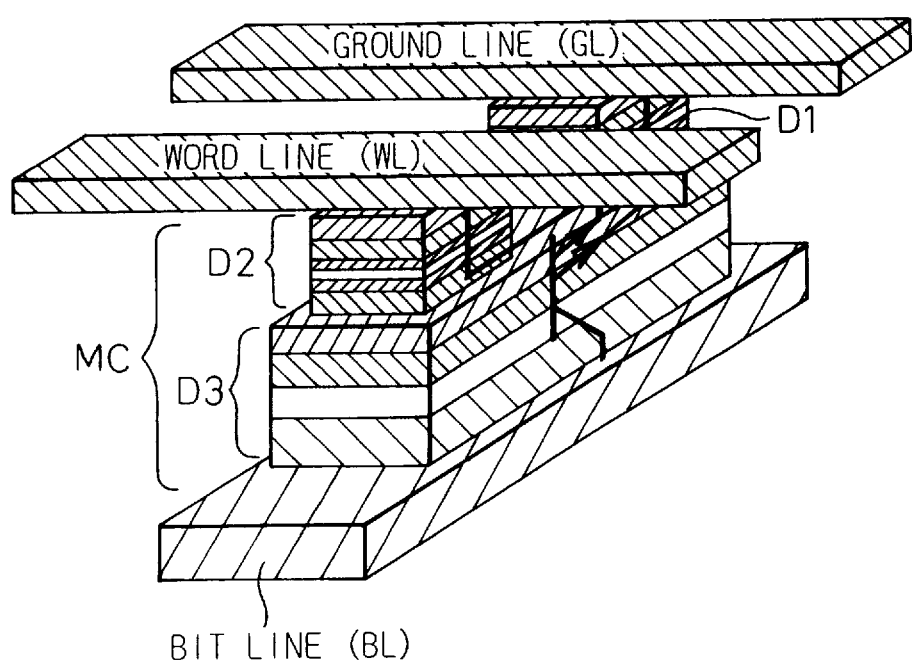
FIG. 2 is a perspective view showing the three-dimensional structure of the memory cell of FIG. 1.

FIG. 2 is a perspective view showing the three-dimensional structure of the memory cell of FIG. 1.

The word line WL and ground line GL are parallel to each other to form a pair and are made from a signal wiring layer. The pair intersects the bit line BL. Between the layer of the word and ground lines and the layer of the bit line, there are layers that form the memory cell MC. A first face of the base-collector junction D3 is electrically connected to the bit line BL. The junction D3 passes a current at a given threshold voltage Vth. A second face of the junction D3 is electrically connected to a first face of the first base-emitter junction D1. A second face of the junction D1 is electrically connected to the ground line GL. The second face of the junction D3 is also electrically connected to a first face of the second base-emitter junction D2, whose second face is electrically connected to the word line WL.

The layer structure of the transistor Tr, i.e., ME-HBT is as mentioned below. The structure employs an Fe-doped InP semiconductor substrate.

|   |   | Dope concentration | Thickness (nm) |
|---|---|---|---|
| 1) Buffer | i-InAlAs |   | 200 |
| 2) Subcollector | n$^{++}$-InGaAs | $5 \times 10^{18}$ | 350 |
| 3) Collector | n-InGaAs | $5 \times 10^{16}$ | 300 |
| 4) Base | p$^{++}$-InGaAs | $3 \times 10^{19}$ | 80 |
| 5) Emitter | n$^{++}$-InAlAs | $3 \times 10^{18}$ | 150 |
|   | p$^{++}$-InGaAs | $N \times 10^{19}$ | 200 |

FIGS. 3A and 4A are sectional views showing the layer structures of memory cells of semiconductor memories according to first and second embodiments of the present invention, respectively, and FIGS. 3B and 4B show energy bands of these structures. These memory cells are each made of an ME-HBT (multiemitter heterojunction bipolar transistor) such as an ME-EHBT (multiemitter Esaki tunnel heterojunction bipolar transistor).

The layer structure of FIGS. 3A and 3B is realized with N=3, and the layer structure of FIGS. 4A and 4B is realized with N=4. As shown in the figures, the buffer, subcollector, collector, base, and emitter layers are sequentially laminated on the Fe-doped InP substrate (100).

The first embodiment of FIGS. 3A and 3B is realized with N=3. The dope concentration of the $p^{++}$-InGaAs layer of 200 nm thick of the emitter layer is $3 \times 10^{19}$. Namely, each memory cell of the first embodiment consists of a multi-emitter Esaki tunnel heterojunction transistor. This transistor is formed by depositing the second emitter layer, i.e., the $p^{++}$-InGaAs layer on the first emitter layer, i.e., the $n^{++}$-InAlAs layer of a multiemitter heterojunction bipolar transistor. The first emitter layer is high-concentration-doped, and the second emitter layer is high-concentration-doped and has a different conduction type from the first emitter layer.

The second embodiment of FIGS. 4A and 4B is realized with N=4. The dope concentration of the $p^{++}$-InGaAs layer of 200 nm thick of the emitter layer is $4 \times 10^{19}$. Namely, the dope concentration of the second emitter layer, i.e., the $p^{++}$-InGaAs layer is high when the second emitter layer is of a p-type. When the second emitter layer is of an n-type, the dope concentration thereof is made lower.

Figure 5:
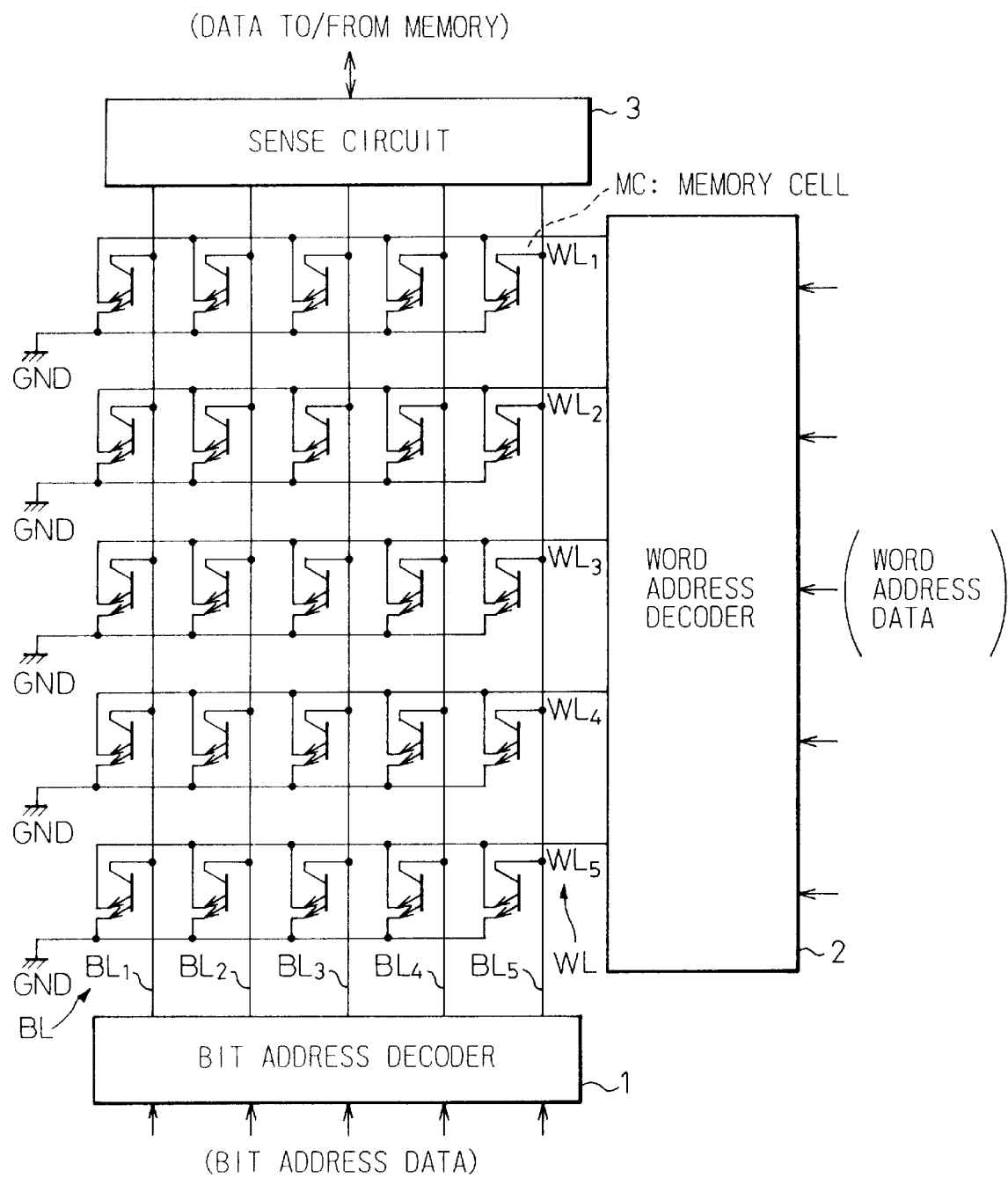
FIG. 5 is a block diagram showing an SRAM according to the present invention.

FIG. 5 is a block diagram showing an SRAM according to the present invention. The SRAM has a bit address decoder 1, a word address decoder 2, and a sense circuit 3. The SRAM consists of a matrix of memory cells and each may be the one shown in FIG. 1.

The SRAM has bit lines BL1, BL2, . . . , word lines WL1, WL2, . . . , and ground lines GL1, GL2, . . . . The word and ground lines are parallel to each other and orthogonal to the bit lines. At the intersections of these lines, the memory cells are arranged respectively.

The bit address decoder 1 is connected to the bit lines and provides them with a bit address signal. The sense circuit 3 detects data stored in the memory cells. The word address decoder 2 is connected to the word lines, to provide them with a word address signal. The ground lines are grounded.

Figure 6:
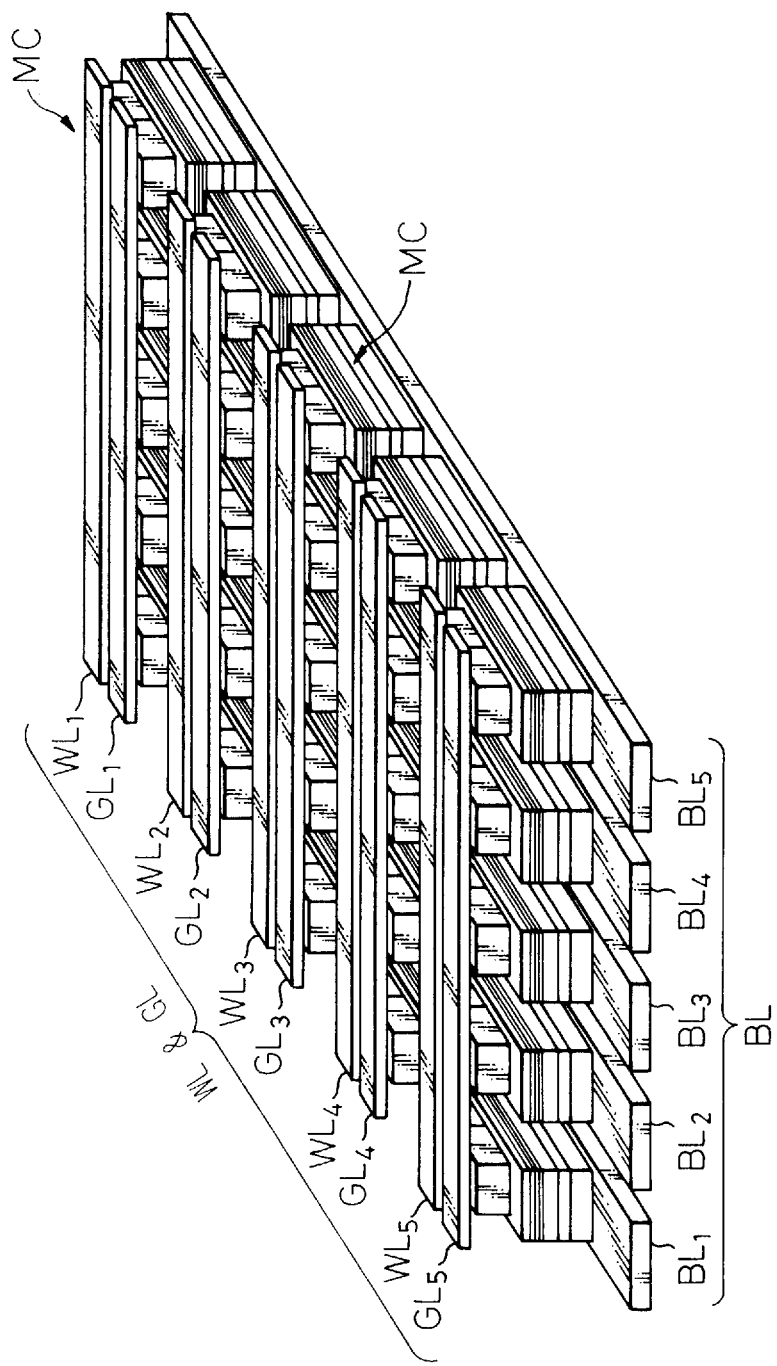
FIG. 6 is a perspective view showing the three-dimensional structure of an SRAM according to the present invention.
Figure 7:
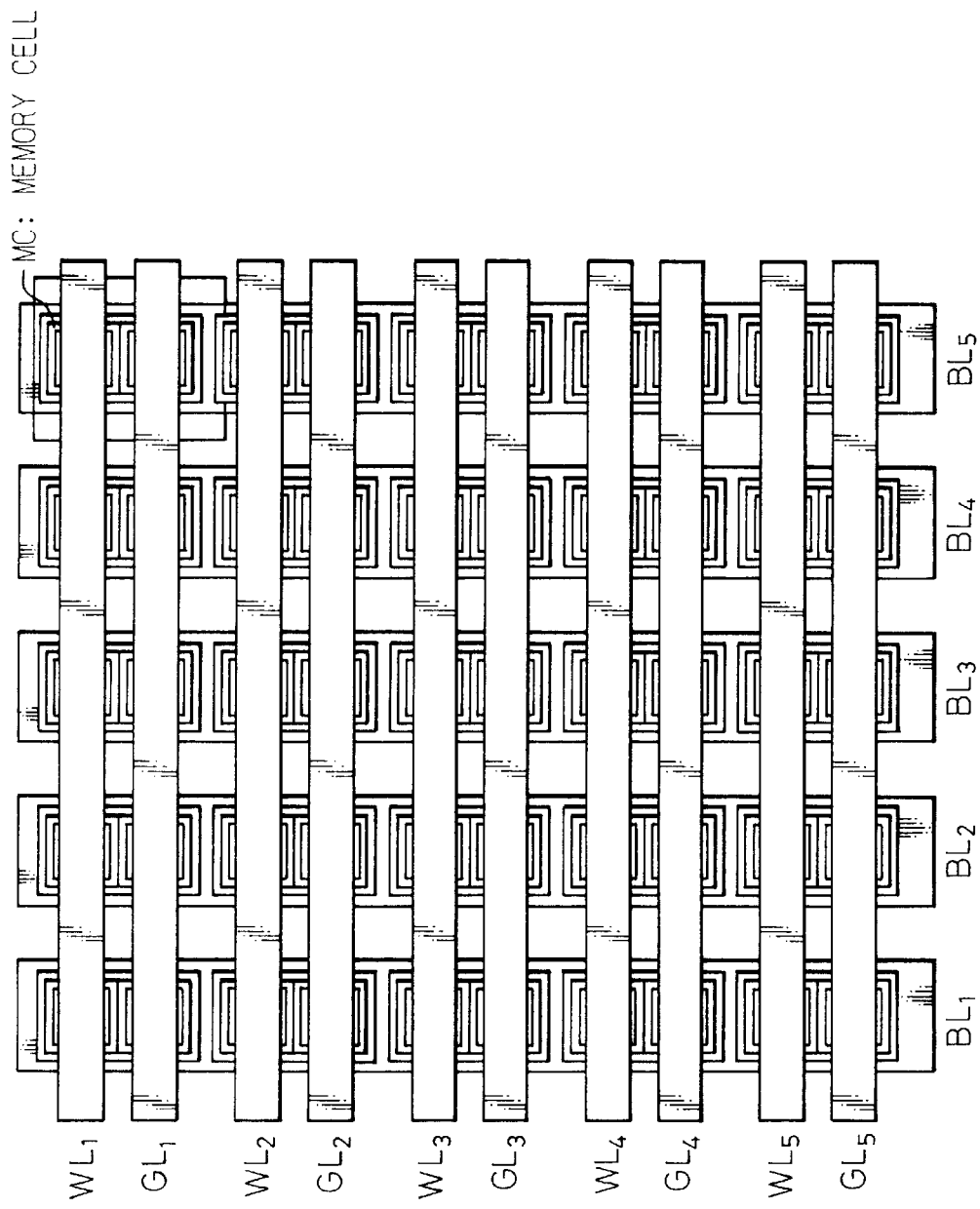
FIG. 7 is a plan view showing the SRAM of FIG. 6.

FIG. 6 is a perspective view showing the three-dimensional structure of an SRAM according to the present invention, and FIG. 7 is a plan view of the same.

The SRAM has bit lines BL1 to BL5 that are in parallel with one another. Pairs of word and ground lines WL1 and GL1 to WL5 and GL5 are electrically not in contact with the bit lines BL1 to BL5 and are orthogonal to the bit lines. At the intersections of these lines, memory cells MC are arranged. Each of the memory cells has a first base-emitter junction D1, a second base-emitter junction D2, and a base-collector junction D3.

The word and ground lines are alternated, so that the area of each memory cell corresponds to about two base-emitter junctions, to realize a high-density arrangement.

Figure 8:
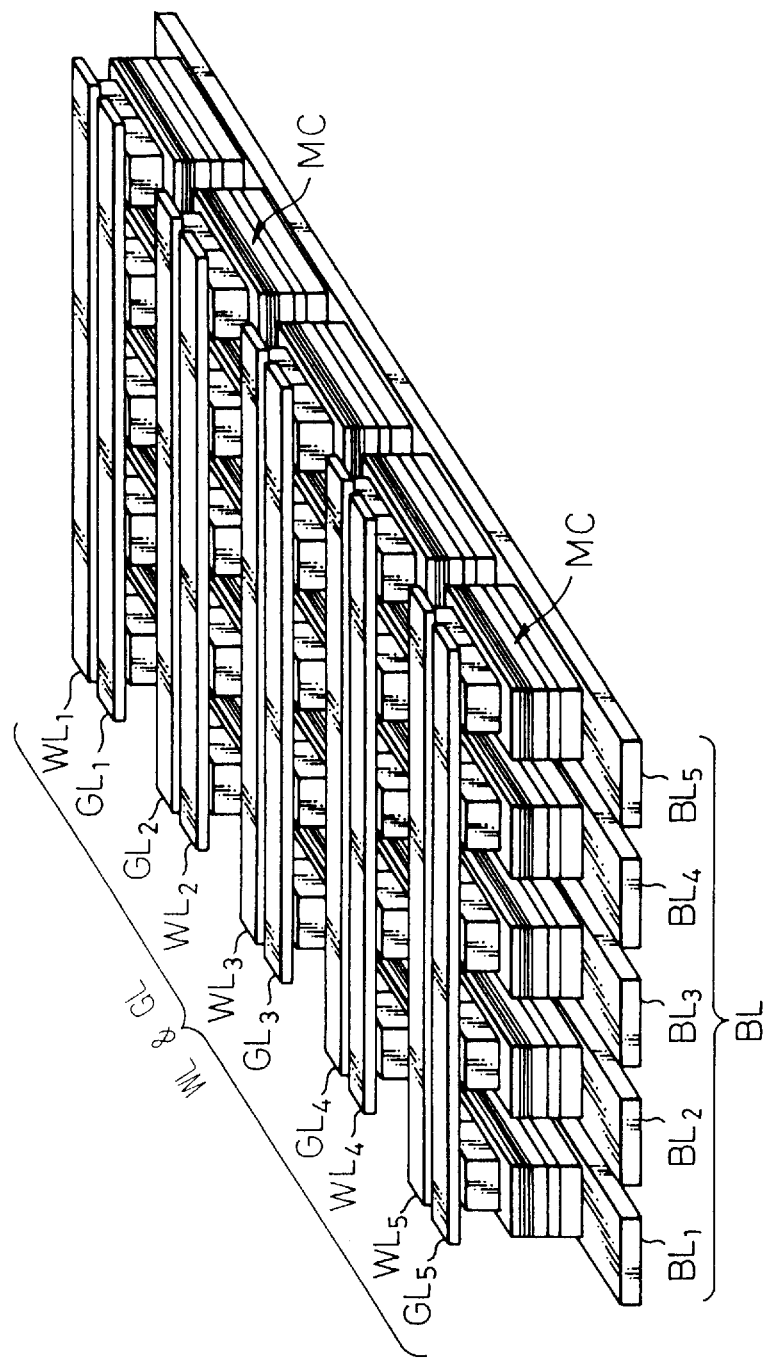
FIG. 8 is a perspective view showing the three-dimensional structure of an SRAM according to the present invention.
Figure 9:
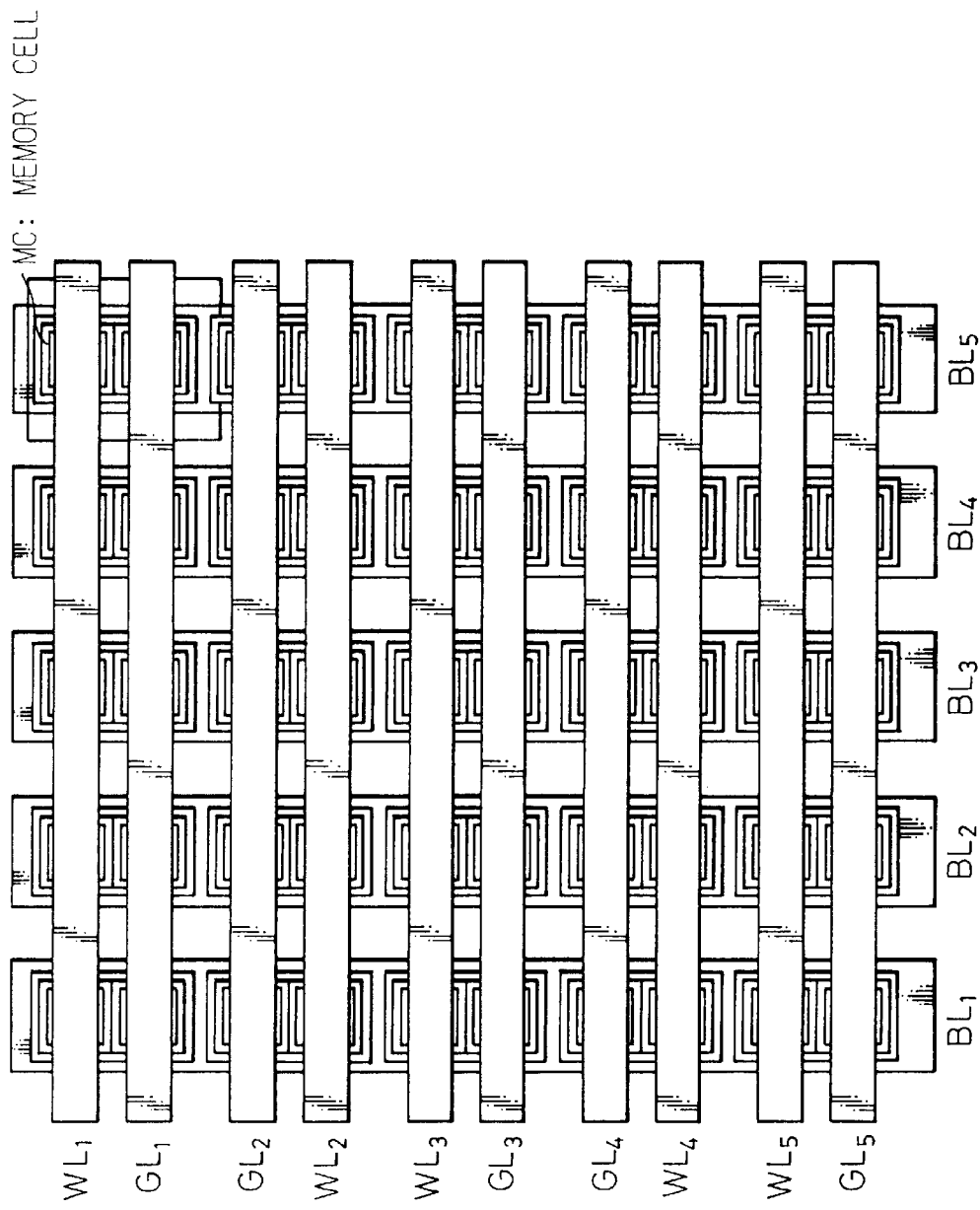
FIG. 9 is a plan view showing the SRAM of FIG. 8.

FIG. 8 is a perspective view showing the three-dimensional structure of an SRAM according to the present invention, and FIG. 9 is a plan view showing the same.

The SRAM has word lines WL1, WL2, . . . and ground lines GL1, GL2, . . . alternated two by two.

Figure 10:
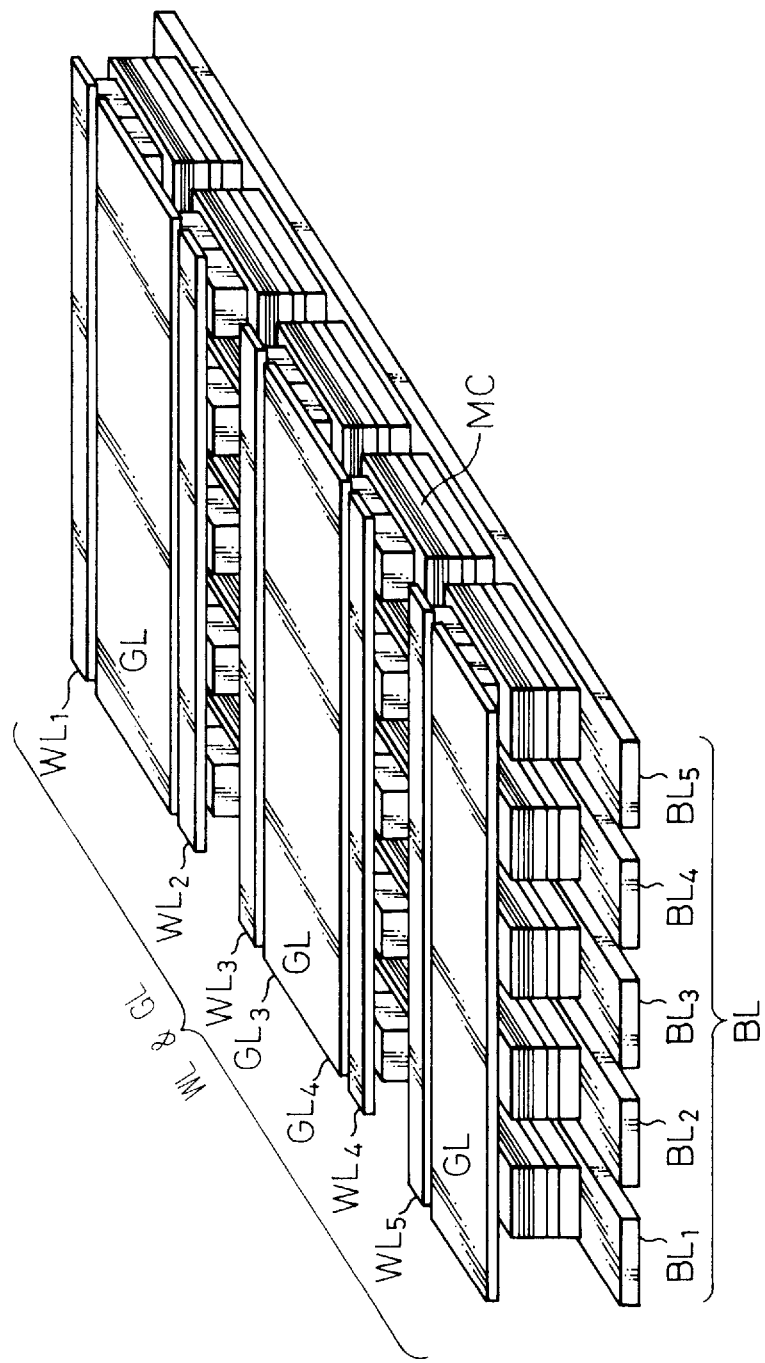
FIG. 10 is a perspective view showing the three-dimensional structure of an SRAM according to the present invention.

FIG. 10 is a perspective view showing the three-dimensional structure of an SRAM according to the present invention, and FIG. 11 is a plan view showing the same.

The adjacent two ground lines are integrated into one. For example, ground lines GL1 and GL2 are integrated into one, and ground lines GL3 and GL4 are integrated into one. Each integrated ground line is capable of passing a large current, or the area of each integrated ground line may be reduced to pass a given current, to thereby realize a high-density arrangement.

To write data to a given memory cell according to any one of the embodiments of FIGS. 6 to 11, a bit address is given to the bit address decoder 1 and a word address is given to the word address decoder 2, to select the given memory cell. In this way, each memory cell is selected according to its address, to write and read data to and from the same. Voltages applied to the bit line BL and word line WL of a memory cell and the operation of writing data to the memory cell will be explained with reference to FIGS. 12A to 23B.

Figure 12A:
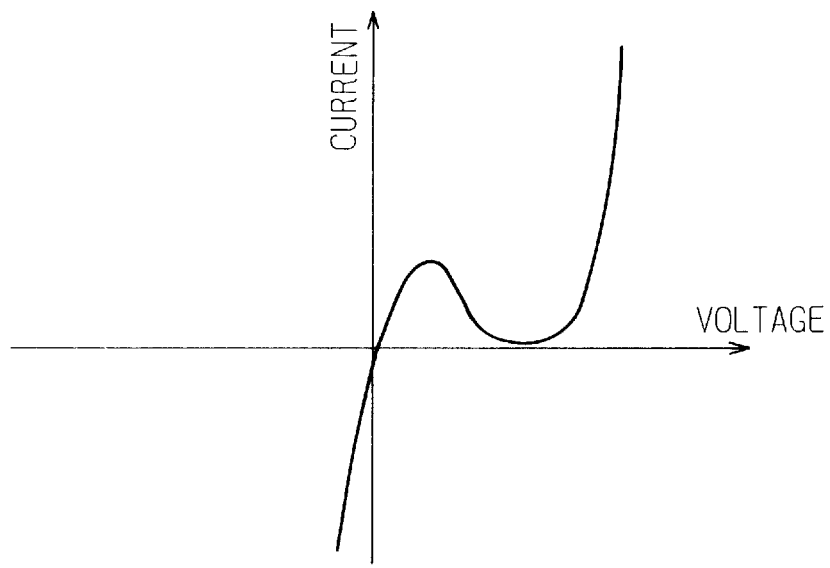
FIGS. 12A and 12B are graphs showing the junction characteristics of memory cells of semiconductor memories according to the present invention.
Figure 12B:
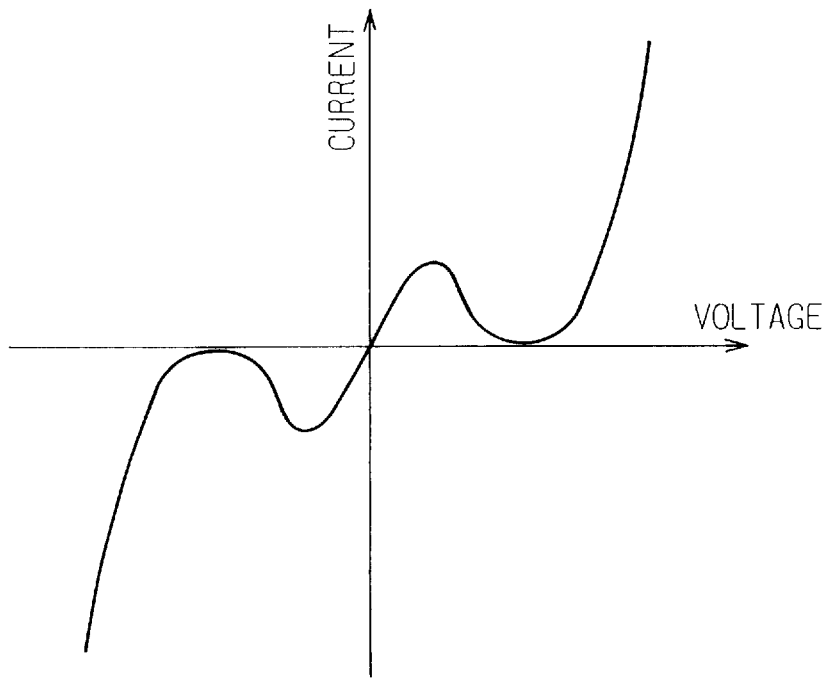

FIG. 12A shows the current-voltage characteristic of an $n^+p^+$ junction of an Esaki diode, and FIG. 12B shows the current-voltage characteristic of a $p^+n^+p^+$ junction. The operation of a memory cell of a semiconductor memory according to the present invention will be explained with reference to these figures The $n^+p^+$ junction of FIG. 12A shows an N-shaped negative differential characteristic having a peak and a valley. The $p^+n^+p^+$ junction of FIG. 12B has two peaks and two valleys.

The $n^+p^+$ junction of high concentration dope has the negative differential characteristic in a forward direction and a zener tunnel characteristic in a reverse direction. The $p^+n^+p^+$ junction shows the negative differential characteristic in forward and reverse directions. An HBT has a high-concentration n-channel emitter and a high-concentration p-channel base. If the HBT is provided with a high-concentration p-channel layer on the emitter thereof, the HBT will have the negative differential characteristic between the emitters and the base thereof in forward and reverse directions. This HBT may serve as a memory cell of an SRAM. This transistor shows two stable operation points S1 and S2 in response to proper voltages applied to the two emitters thereof, and the memory cell consisting of the transistor may store one of two pieces of data corresponding to these points S1 and S2.

When writing data to the memory cell, the prior art such as Japanese Unexamined Patent Publication No. 5-234361 mentioned above applies a potential difference exceeding the forward and reverse breakdown voltages of the transistor to the base and collector of the transistor. The reverse bias breakdown voltage of the base-collector of the bipolar transistor is determined by a band gap and is about 1.4 V when the transistor employs GaAs and about 0.8 V when the transistor employs InGaAs. On the other hand, the forward bias breakdown voltage of the transistor is determined by an avalanche potential and is about 10 V or over, which is impractically high. The present invention solves this problem.

Up to a second rise of the N-shaped negative characteristic curve of the transistor, an emitter current component is determined by a reverse injection of holes, and therefore, the emitter injects no minority carriers. When the transistor sustains data at the stable operation point S1, the transistor provides no collector current in response to a positive potential applied to the collector because a voltage applied to a resonance barrier beside the emitter is low. When the transistor holds data at the stable operation point S2, the transistor provides a collector current in response to the positive potential applied to the collector. Namely, it is possible to read data out of the transistor by applying the positive potential to the collector and by determining whether or not the transistor provides a collector current.

To clearly read data out of the transistor, a potential higher than a sustain potential must be applied to a word line connected to the transistor, to increase a current from the emitter. According to the present invention, the collector theoretically passes a current larger than the peak current. This results in solving the problems of the conventional double-emitter RHET, i.e., the problem of the peak current that limits a read speed and the problem of the valley current that determines power consumption.

To write data to the transistor at the stable operation point S2 thereof, a voltage is applied to the collector so that the collector-base junction does not affect the negative differential characteristic. Namely, the voltage applied to the collector is set to provide no gain and be below a reverse breakdown voltage. In practice, the voltage is set to a ground level of 0 V. The two base-emitter junctions of the transistor have different N-shaped negative differential characteristics involving different peak currents. Accordingly, a potential applied to the word line connected to the transistor is decreased and then increased to uniquely set the stable operation point of the transistor to S2 according to a mobile operation principle. To write data to the transistor at the stable operation point S1 thereof, a voltage exceeding the reverse breakdown voltage of the base-collector junction is applied to the collector, and the potential applied to the word line is increased and decreased. As a result, the stable operation point of the transistor is uniquely set to S1. In this way, data written to the transistor is determined according to the voltage applied to the collector. The data write operation is carried out without regard to a forward current that influences the operation margins of peripheral circuits.

As explained above, writing data to the stable operation point S2 is carried out with a collector voltage equal to a sustain voltage, and writing data to the stable operation point S1 is carried out with a collector voltage lower than the sustain voltage. At this time, the potential of the word line is set to be lower than a sustain potential. Thereafter, the potential of the word line is increased above the sustain potential and then to the sustain potential. As a result, the data is written to one of the stable operation points S1 and S2 of the transistor without a selection signal to a driver of the word line.

Figure 13:
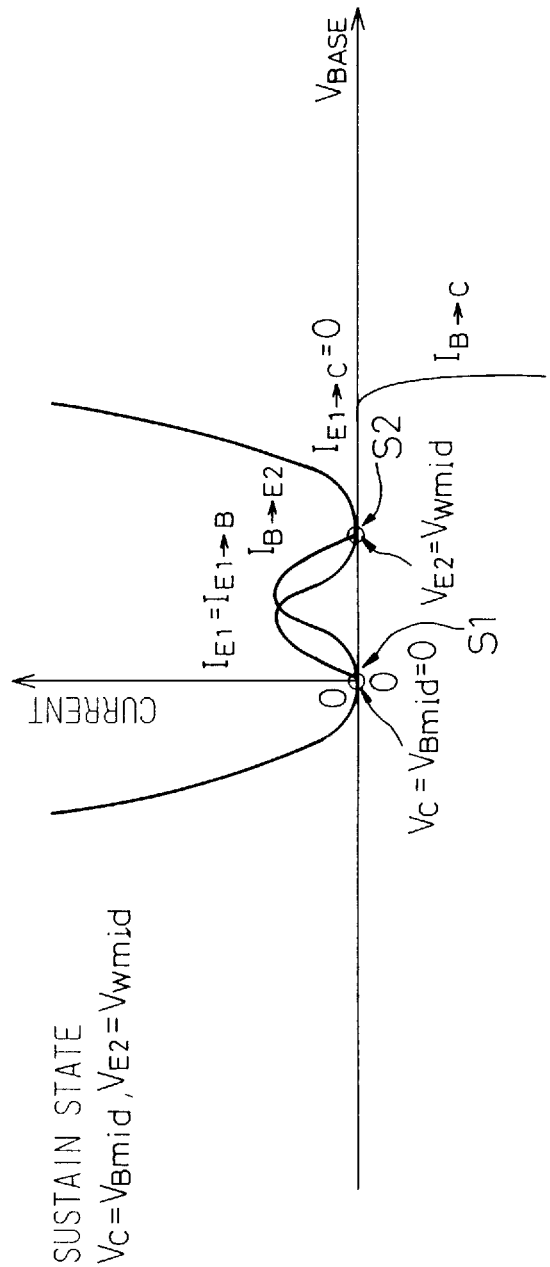
FIG. 13 explains a sustain operation of a memory cell of a semiconductor memory according to the present invention.

FIG. 13 explains a sustain operation of a memory cell of a semiconductor memory according to the present invention. The memory cell has two stable operation points S1 and S2. A current IE1-B (IE1) flows from a first emitter E1 to a base B, a current IE1-C from the first emitter E1 to a collector C, and a current IB-E2 from the base B to a second emitter E2. A collector voltage VC is applied to a bit line BL, and a second emitter voltage VE2 is applied to a word line WL. Here, VC=VBmid=0, and VE2=VWmid=0.

The memory cell, i.e., the transistor has first and second base-emitter junctions D1 and D2 and a base-collector junction D3. The junctions D1 and D2 and a base layer form series circuits that produce the two stable operation points S1 and S2. To sustain data written to the memory cell, VWmid (VE2)=0 V is applied to the second emitter E2 through the word line WL, to bias the transistor to the valley of the N-shaped negative differential characteristic of the transistor. At the same time, VBmid (VC)=0 V is applied to the collector C through the bit line BL. The VBmid must be sufficiently low to provide no gain with respect to a ground level (GND) and must be higher than the reverse breakdown voltage (-Vrbr) of the base-collector junction D3. In this embodiment, the VBmid is equal to a ground level of 0 V.

FIGS. 14A to 14C explain a read operation of the memory cell. As explained above, the memory cell MC has the first and second base-emitter junctions D1 and D2, which form, together with the base layer, the series circuits that provide the two stable operation points S1 and S2.

In FIG. 14A, VBhigh (VC) is applied to the collector C through the bit line BL so that the ME-HBT or ME-EHBT of the memory cell MC provides a sufficient gain. The base potential of the operation point S1 is lower than that of the operation point S2. Accordingly, the operation point S1 provides a low gain and the operation point S2 provides a high gain. In FIG. 14B, a high potential VWhigh (VE2) is applied to the second emitter E2 through the word line WL. VWhigh is higher than the sustain potential but is sufficiently low not to destruct data stored in the memory cell. Under this state, a collector current to the bit line is detected to specify one of the stable operation points S1 and S2, to thereby read the data.

The operation of FIG. 14A selects the bit line BL, the operation of FIG. 14B selects the word line WL, and the operation of FIG. 14C selects both the bit line BL and word line WL. Through these operations, the operation point S1 having a low base potential provides a low gain, and the operation point S2 having a high base potential provides a high gain. The potential VE2=VWhigh applied to the second emitter E2 through the word line WL is higher than the sustain potential but sufficiently low not to destruct data stored in the memory cell. Under this state, a current flowing through the bit line is detected to specify one of the operation points S1 and S2, to thereby read the data out of the memory cell.

Figure 15A:
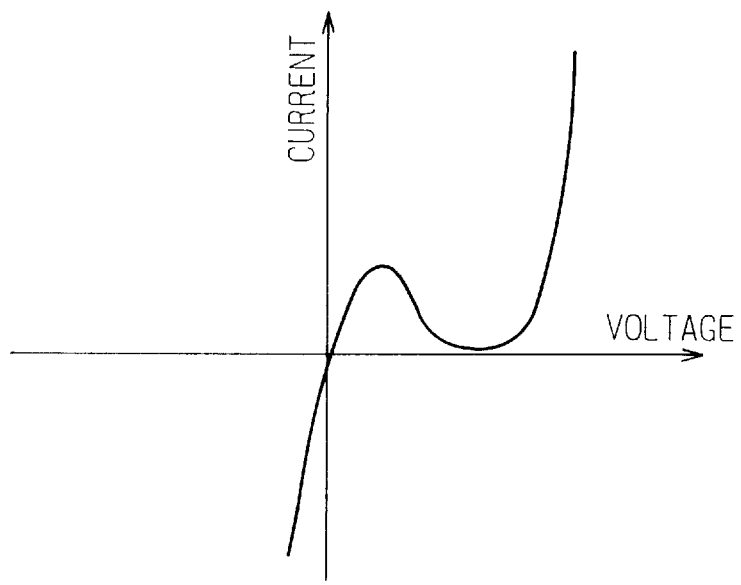
FIGS. 15A and 15B are graphs showing the junction characteristics of memory cells of semiconductor memories with low- and high-concentration junctions according to the present invention.
Figure 15B:
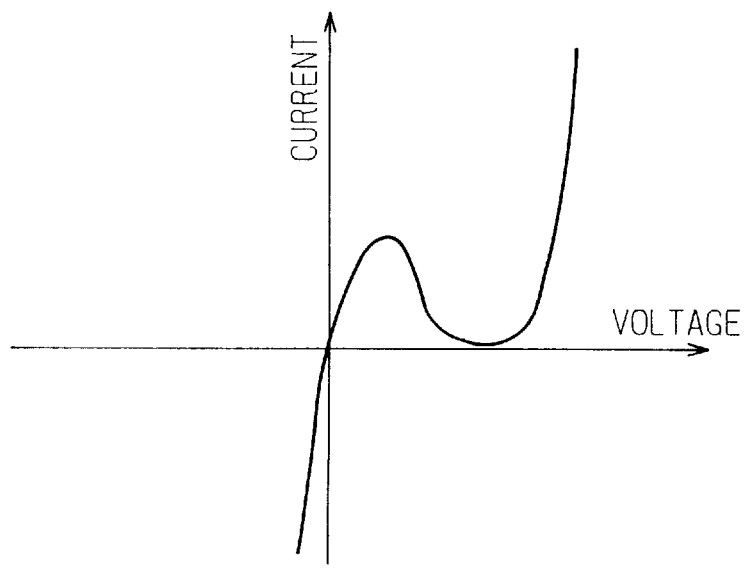

FIG. 15A shows the current-voltage characteristic of an $n^+p^+$ junction of a memory cell of a semiconductor memory according to the present invention with the dope concentration of a $p^{++}$-InGaAs layer (second emitter layer) of FIG. 4A being low, and FIG. 15B shows the current-voltage characteristic of an $n^+p^+$ junction of a memory cell of a semiconductor memory according to the present invention with the dope concentration of a second emitter layer being high. The peak of the N-shaped negative differential characteristic of the high dope concentration junction is higher than that of the low dope concentration junction.

When the second emitter layer is of a p-channel, the present invention increases the dope concentration of the second emitter layer. When the second emitter layer is of an n-channel, the present invention decreases the dope concentration thereof.

Figure 16:
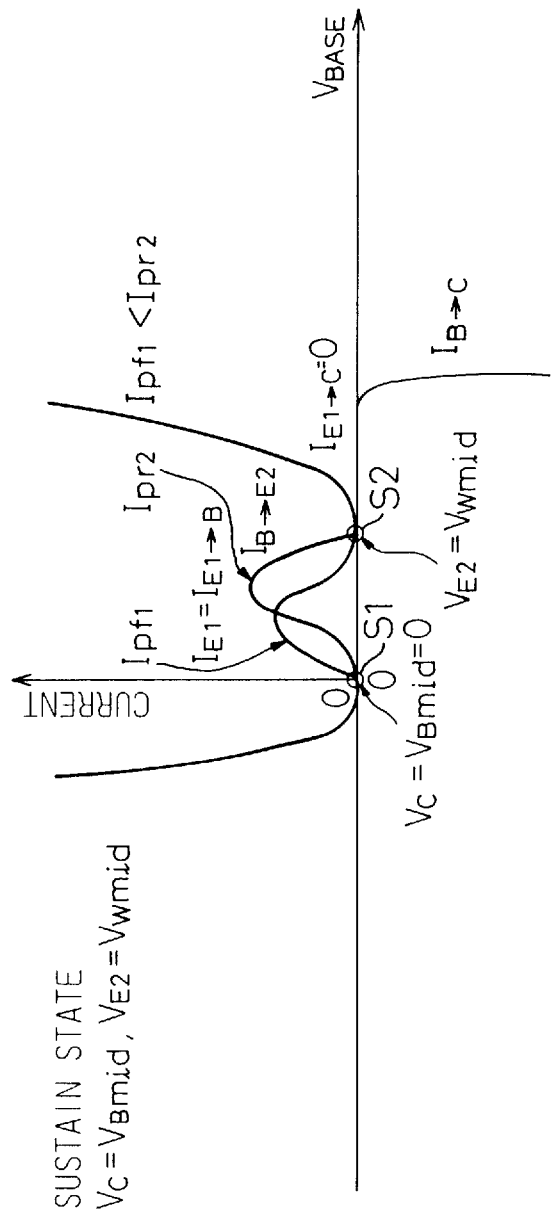
FIG. 16 explains a sustain operation of a memory cell of a semiconductor memory according to the present invention.

FIG. 16 explains a sustain operation of a memory cell of a semiconductor memory according to the present invention.

The memory cell MC is made of a transistor Tr having a base B, a collector C, and first and second emitters E1 and E2. The transistor Tr has a negative differential characteristic in which a forward peak current Ipf1 of the first emitter E1 is smaller than a reverse peak current Ipr2 of the second emitter E2 (Ifp1<Ipr2). Note that the forward peak current Ipf1 is a peak current of the negative differential characteristics at the first emitter E1 where the base is biassed to a positive potential with respect to the potential of the first emitter. Further, the reverse peak current Ipr2 is a peak current of the negative differential characteristics at the second emitter E2 where the base is biassed to a negative potential with respect to the potential of the second emitter.

To sustain data written to the memory cell, VWmid (VE2)=0 V is applied to the second emitter E2 through the word line WL, to bias the transistor to the valley of the N-shaped negative differential characteristic. At the same time, VBmid (VC)=0 V is applied to the collector C through the bit line BL. The VBmid must be sufficiently low to provide no gain with respect to a ground level (GND) and must be higher than the reverse breakdown voltage (-Vrbr) of the base-collector junction D3. In this embodiment, the VBmid is equal to a ground level of 0 V.

FIGS. 17A and 17C explain a read operation of the memory cell. As explained above, the transistor Tr has the negative differential characteristic in which a forward peak current Ipf1 of the first emitter E1 is smaller than a reverse peak current Ipr2 of the second emitter E2 (Ipf1<Ipr2). The memory cell has the base-emitter junctions D1 and D2. The junctions D1 and D2 and the base layer form the series circuits that provide the two stable operation points S1 and S2.

A potential VC=VBhigh is applied to the collector C through the bit line BL so that the transistor Tr provides a sufficient gain. At this time, the operation point S1 involves a low base potential to provide a low gain, and the operation point S2 involves a high base potential to provide a high gain. In FIG. 17B, a high potential VE2=VWhigh is applied to the second emitter E2 through the word line WL. The VWhigh is higher than the sustain potential but sufficiently low not to destruct data stored in the memory cell. Under this state, a collector current to the bit line is detected to specify one of the stable operation points S1 and S2, to thereby read the data.

The operation of FIG. 17A selects the bit line BL, the operation of FIG. 17B selects the word line WL, and the operation of FIG. 17C selects both the bit line BL and word line WL.

FIGS. 18A to 18G explain a write operation of a memory cell of a semiconductor memory according to the present invention. The memory cell is made of a transistor Tr such as an ME-RBT or ME-ERBT having a base B, a collector C, and first and second emitters E1 and E2. The transistor has first and second base-emitter junctions D1 and D2 and a base-collector junction D3. The junctions D1 and D2 and a base layer form series circuits that provide two stable operation points S1 and S2. The write operation of this embodiment is carried out to the operation point S2 involving a high base potential. A current IB-C flows from the base B to the collector C, a current IE1-B from the first emitter E1 to the base B, a current IB-E2 from the base B to the second emitter E2, and a current IE1-C from the first emitter E1 to the collector C. A voltage VE2 is applied to the second emitter E2 through a word line WL, and a voltage VC is applied to the collector C through a bit line BL.

Figures 18A, 18B:
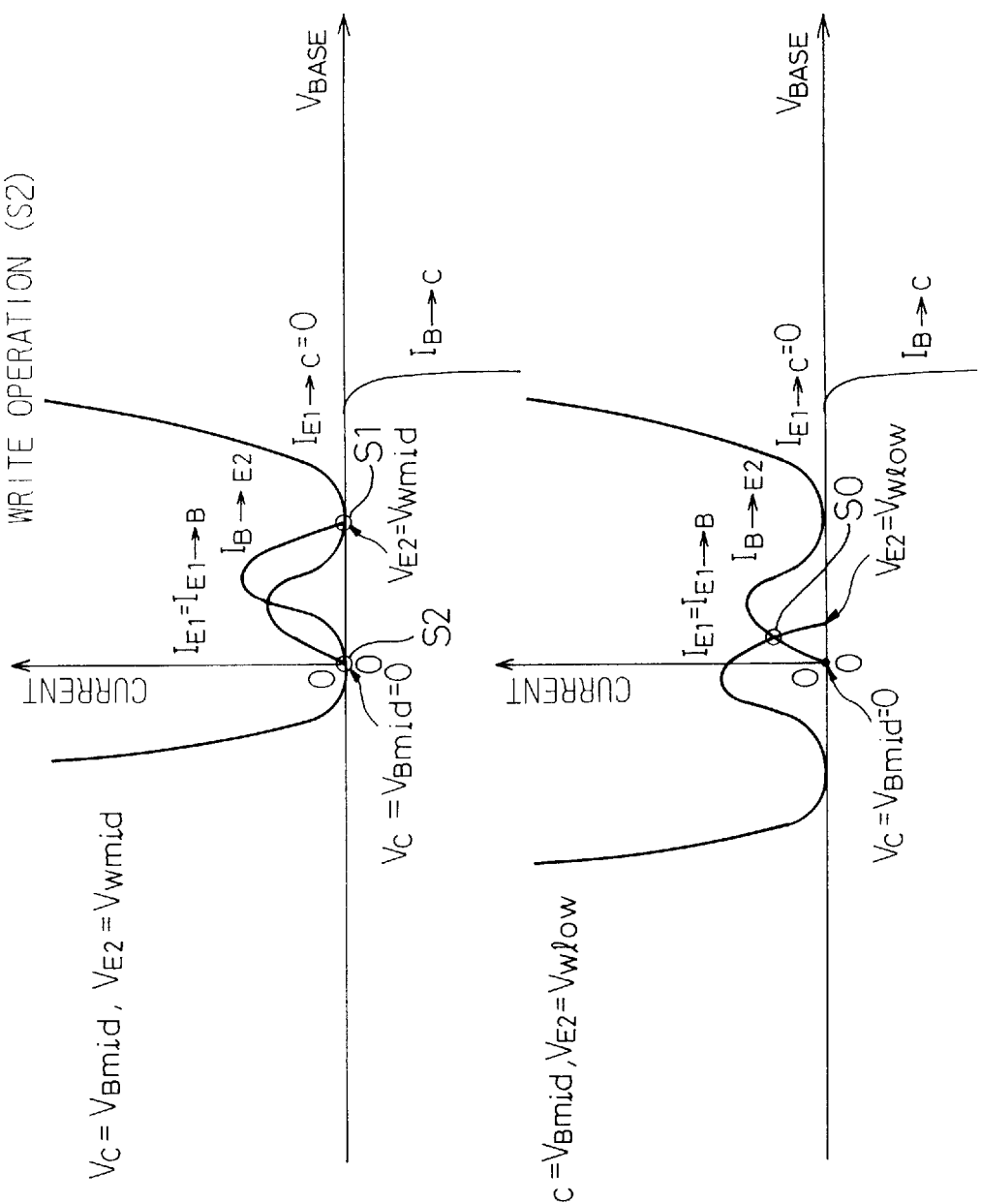

In FIG. 18A, the memory cell has data at one of the operation points S1 and S2. In FIG. 18B, a low potential VWlow=VE2 is applied to the second emitter E2 through the word line WL. The potential VWlow is sufficiently low to destruct the operation points S1 and S2 and establish a monostable operation point S0. At this time, a sustain potential of VC=VBmid=0 V is applied to the collector C through the bit line BL.

Figures 18C, 18D:
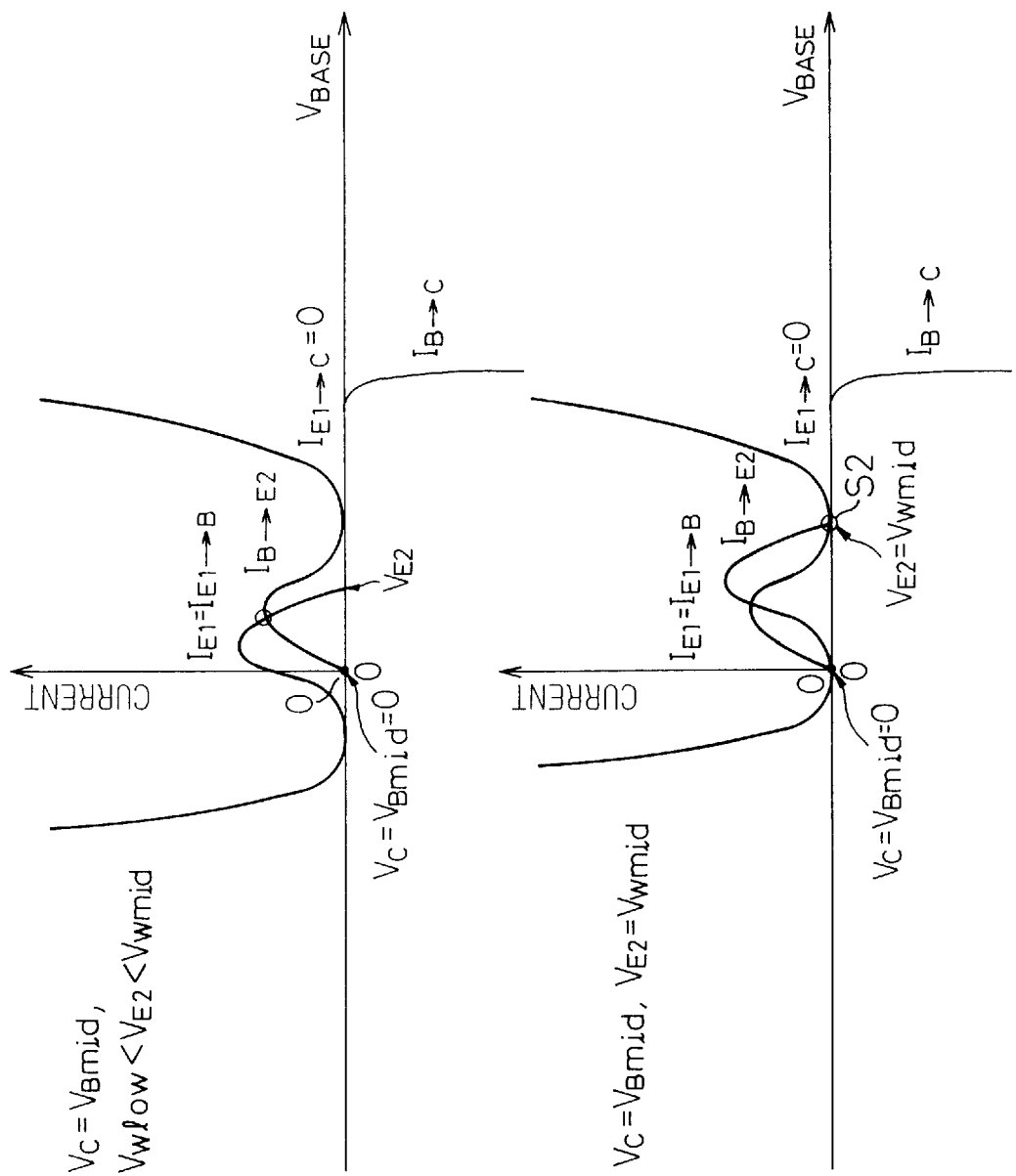

In FIG. 18D, the sustain potential is maintained, and the potential VE2=VWmid is again applied to the second emitter E2 through the word line WL. As a result, the write operation is carried out to the operation point S2 of every memory cell connected to the word line WL in question. FIG. 18C shows a transition period in which the potential applied to the second emitter E2 through the word line WL is changed from the low potential VWlow to the sustain potential VWmid (VWlow<VE2<VWmid).

In FIG. 18F, a high potential VE2=VWhigh is applied to the second emitter E2 through the word line WL, to destruct the two stable operation points S1 and S2. FIG. 18E shows a transition period in which the potential applied to the second emitter E2 is changed from the sustain potential VWmid to the high potential VWhigh (VWmid<VE2<VWhigh).

Figure 18G:
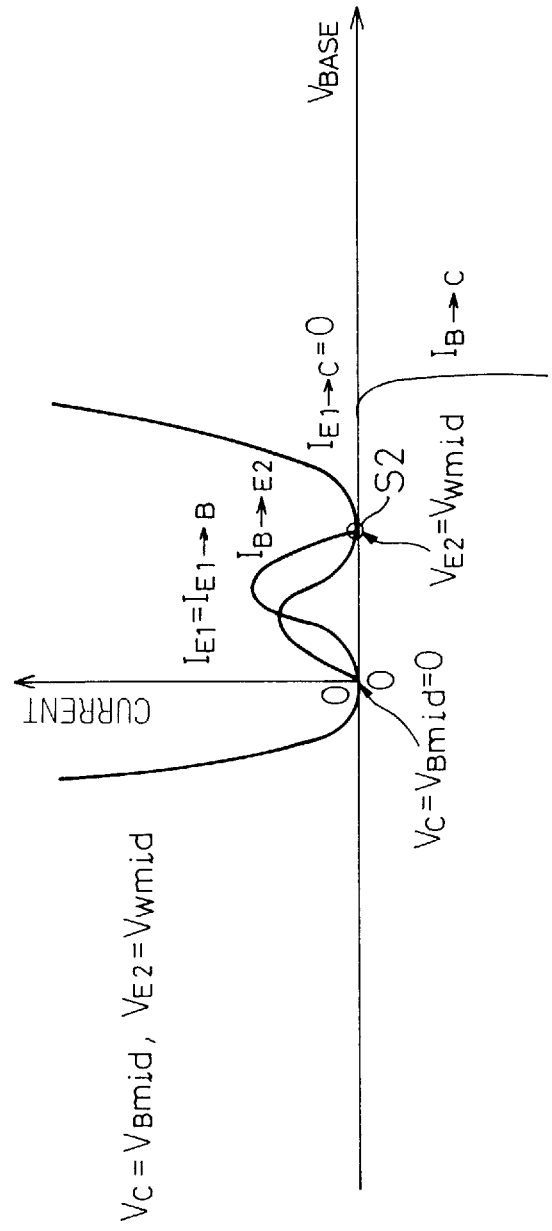

In FIG. 18G, the sustain potential VE2=VWmid is again applied to the second emitter E2 through the word line WL, to write data to the operation point S2 of the memory cell MC.

FIGS. 19A to 19G explain a write operation carried out to the stable operation point S1 involving a low base potential of the memory cell mentioned above.

Figures 19A, 19B:
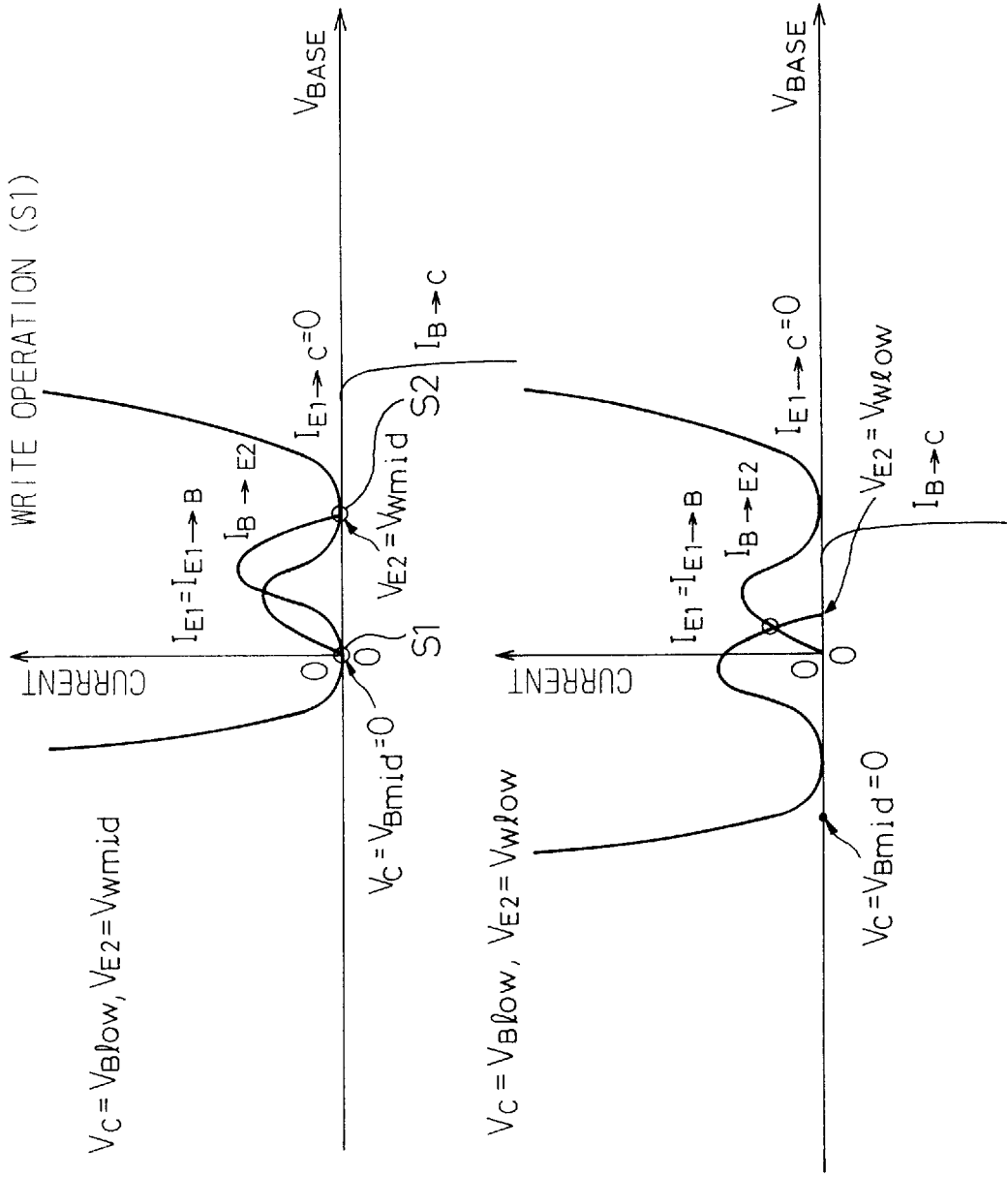

In FIG. 19A, the memory cell has data at one of the operation points S1 and S2. A low potential VC=VBlow is applied to the collector through the bit line BL. The potential VBlow is lower than a sustain potential. In FIG. 19B, a potential VE2=VWlow, which is lower than a sustain potential, is applied to the second emitter E2 through the word line WL. In FIG. 19D, the sustain potential VE2=VWmid is applied to the second emitter E2 through the word line WL. As a result, the write operation is carried out to the operation point S1 of every memory cell connected to the word line in question. FIG. 19C shows a transition period in which the potential applied to the second emitter E2 through the word line WL is changed from the low potential VWlow to the sustain potential VWmid (VWlow<VE2<Vwmid).

In FIG. 19F, a high potential VE2=VWhigh is applied to the second emitter E2 through the word line WL, to destruct the two stable operation points S1 and S2. FIG. 19E shows a transition period in which the potential applied to the second emitter E2 is changed from the sustain potential VWmid to the high potential VWhigh (VWmid<VE2<VWmid).

In FIG. 19G, the sustain potential VE2=Vwmid is applied to the second emitter E2 through the word line WL, to write data to the operation point S1 of the memory cell MC.

In this way, data is written to any one of the operation points S1 and S2 of the memory cell MC. In principle, the write operation applies a current larger than a peak current to the collector C of the transistor Tr. Accordingly, the present invention is not limited by the peak current that determines a reading speed and the valley current that determines power consumption.

A rewrite operation of the memory cell to which data has been written according to any one of the embodiments of FIGS. 18A to 19G.

FIGS. 20A and 20B explain the operations of memory cells whose data are not rewritten. FIGS. 21A and 21B explain the operations of memory cells whose data are rewritten. Each memory cell has first and second base-emitter junctions D1 and D2. The junctions D1 and D2 and a base layer form series circuits that provide two stable operation points S1 and S2. The memory cells of FIGS. 20A and 21A will store data at the operation point S2, and the memory cells of FIGS. 20B and 21B will store data at the operation point S1.

The memory cell of FIG. 20A has data at the operation point S2 involving a high base potential and is not rewritten. A voltage VBL=VC applied to the collector C through the bit line BL is changed from an intermediate voltage VBmid to a high voltage VBhigh at T0 to T3. A voltage VWL=VE2 applied to the second emitter E2 through the word line WL is changed from an intermediate voltage VWmid to a high voltage VWhigh at T1, to carry out a read operation, and at T4, from VWmid to a low voltage VWlow. Thereafter, the voltage VWL is changed to VWmid, to write the same data to the operation point S2.

The memory cell of FIG. 20B has data at the operation point S1 involving a low base potential and is not rewritten. The bit line voltage VBL is changed from VBmid to VBhigh at T0 to T3. The word line voltage VWL is changed from VWmid to VWhigh at T1 to carry out a read operation, and at T4, from VWmid to VWlow. Thereafter, the voltage VWL is changed to VWmid, to VWhigh at T6, and to VWmid to write the same data to the operation point S1.

As is apparent in FIGS. 20A and 20B, a large current IBL flows through the bit line BL at T1 when data is stored to the operation point S2. When data is stored to the operation point S1, no current IBL flows at T1, and an instantaneous current IBL flows at T5 through the bit line BL.

The memory cell of FIG. 21A has data at the operation point S1 and is rewritten. The word line voltage VWL=VE2 applied to the second emitter E2 through the word line WL is changed from VWmid to VWhigh at T1 to carry out a read operation. The word line voltage VWL is changed from VWmid to VWlow at T4 and again to VWmid to write data to the other operation point S2.

The memory cell of FIG. 21B has data at the operation point S2 and is rewritten. The word line voltage VWL is changed from VWmid to VWhigh at T1, from VWmid to VWlow at T4, from VWmid to VWhigh at T6, and again to VWmid. The bit line voltage VBL is changed from VBmid to VBhigh at T6 and again to VBmid to write data to the other operation point S1. As is apparent in FIGS. 21A and 21B, an instantaneous current IBL flows through the bit line BL at T5 when data is stored to the operation point S1.

If the number of memory cells connected to a given word line is smaller than the number of bits to which given data is written in the embodiments of FIGS. 20A to 21B, data stored in memory cells to which no data is written is read once at T1, and the read data is written to the memory cells at write timing.

As shown in FIGS. 20A and 21A, the potential VBL=VC applied to the collector C through the bit line BL is maintained, and the low potential VWlow=VE2 is applied to a given word line WL at T4 to destruct the two stable operation points S1 and S2 of every memory cell connected to the word line WL. Thereafter, the sustain potential VWmid is applied to the word line WL, to write data to the stable operation point S2 of the memory cells. In this way, the voltage applied to the collector of a memory cell to write data to the operation point S2 is set so that the base-collector junction does not influence the negative differential characteristic. Namely, the collector voltage is set to provide no gain and be below a reverse breakdown voltage. In practice, the collector voltage is set to be equal to a ground level. Since the two base-emitter junctions of the memory cell have N-shaped negative differential characteristics having different peak currents, the memory cell changes from a monostable state to the bistable state when a potential applied to a corresponding word line is decreased and then increased. At this time, the operation point of the transistor is uniquely set to S2 according to Mobile operation principle.

After data is written to the stable operation point S2 of the memory cells, data may be written to the operation point S1 of some of the memory cells. To achieve this, a low potential VBlow, which is lower than a sustain potential, is applied to bit lines BL connected to the memory cells to which data is written to the operation point S1 thereof. Namely, a voltage VC=VBlow is applied to the collectors of these memory cells at T6. A high potential VE2=VWhigh is applied to the second emitters E2 through the given word line WL, to destruct the two stable operation points at T6. Thereafter, the sustain potential VE2=VWmid is applied to the second emitter E2 through the word lines at T7, to write data to the operation points S1. At this time, a current flows over the threshold of the reverse breakdown voltage of the base-collector junction, to invert the sizes of the peak currents of the N-shaped negative differential characteristics of the two base-emitter junctions. Accordingly, when the potential applied to the word line is decreased and then increased to change a monostable state to the bistable state, the operation point of the memory cell is uniquely set to S1 according to the mobile operation principle. In this way, the present invention determines data to be written to a memory cell according to a voltage applied to the collector of the memory cell. The present invention is capable of carrying out a write operation to a memory cell without regard to the forward characteristic of the memory cell that greatly affects the operation margins of peripheral circuits.

FIGS. 22A and 22B explain the operations of memory cells whose data are not rewritten. FIGS. 23A and 23B explain the operations of memory cells whose data are rewritten. Each memory cell has first and second base-emitter junctions D1 and D2. The junctions D1 and D2 and a base layer form series circuits that provide two stable operation points S1 and S2. The memory cells of FIGS. 22A and 23A will store data at the operation point S2, and the memory cells of FIGS. 22B and 23B will store data at the operation point S1.

The memory cell of FIG. 22A has data at the operation point S2 and is not rewritten. A voltage VBL=VC applied to the collector C through the bit line BL is changed from an intermediate voltage VBmid to a high voltage VBhigh at T0 to T3. A voltage VWL=VE2 applied to the second emitter E2 through the word line WL is changed from an intermediate voltage VWmid to a high voltage VWhigh at T1, to carry out a read operation, and at T5, from VWmid to VWhigh. Thereafter, the voltage VWL is changed to VWmid, to write the same data to the operation point S2.

The memory cell of FIG. 22B has data at the operation point S1 and is not rewritten. The bit line voltage VBL is changed from VBmid to VBhigh from T0 to T3. The word line voltage VWL is changed from VWmid to VWhigh at T1 to carry out a read operation, and at T4, from VWmid to VWlow. Thereafter, the voltage VWL is changed to VWhigh at T5, and to VWmid to write the same data to the operation point S1.

As is apparent in FIGS. 22A and 22B, a large current IBL flows through the bit line BL at T1 when data is stored to the operation point S2. When data is stored to the operation point S1, no current IBL flows at T1, and an instantaneous current IBL flows at T5 through the bit line BL.

The memory cell of FIG. 23A has data at the operation point S1 and is rewritten. The word line voltage VWL=VE2 applied to the second emitter E2 through the word line WL is changed from VWmid to VWhigh at T1 to carry out a read operation. The word line voltage VWL is changed from VWmid to VWlow at T4, to VWhigh at T5, and again to VWmid to write data to the other operation point S2.

The memory cell of FIG. 23B has data at the operation point S2 and is rewritten. The word line voltage VWL is changed from VWmid to VWhigh at T1, from VWmid to VWlow at T4, to VWhigh at T5, and again to VWmid. The bit line voltage VBL is changed from VBmid to VBlow at T3 to T6 and again to VBmid to write data to the other operation point S1. As is apparent in FIGS. 23A and 23B, an instantaneous current IBL flows through the bit line BL at T5 when data is stored to the operation point S1.

If the number of memory cells connected to a given word line is smaller than the number of bits to which given data is written in the embodiments of FIGS. 22A to 23B, data stored in memory cells to which no data is written is once read at T1, and the data is written to the memory cells at write timing.

In this way, the examples of FIGS. 22B and 23B write data to the first stable operation point S1 involving a low base potential. In this case, the potential VBlow, which is lower than the sustain potential, is applied to the bit line BL at T3 to T6. The examples of FIGS. 22A and 23A write data to the second stable operation point S2 involving a high base potential. In this case, the sustain potential VBmid is applied to the bit line BL at T3 to T6.

Under this state, the low potential VWlow, which is sufficiently low to destruct the two stable operation points S1 and S2, is applied to the word line WL at T4 as shown in FIGS. 22A to 23B. Thereafter, the potential VWhigh, which is higher than the sustain potential, is applied to the word line WL at T5. Next, the sustain potential VWmid is again applied to the word line WL at T6 to write data at a required one of the operation points S1 and S2 of the memory cell.

As explained above, the potential VBL=VC applied to the collector C of the memory cell through the bit line BL is set to the sustain potential VBmid, to write data to the operation point S2. To write data to the operation point S1, the potential VBL=VC is set to the low potential VBlow, which is lower than the sustain potential. Under this state, the potential VWL=VE2 applied to the second emitter through the word line WL is changed from VWlow, which is lower than the sustain potential, to VWhigh, which is higher than the sustain potential. Thereafter, the word line potential VWL is returned to the sustain potential VWmid. In this way, data is written to any one of the operation points S1 and S2 without providing a select signal.

Figure 24A:
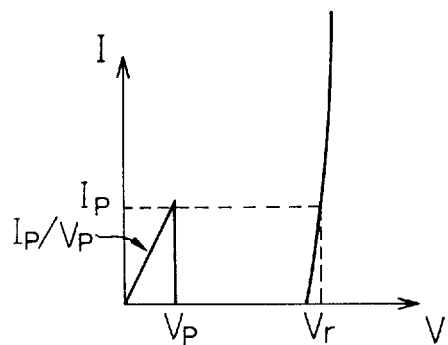
FIGS. 24A and 24B explain a read operation of the memory cell of FIGS. 4A and 4B.
Figure 24B:
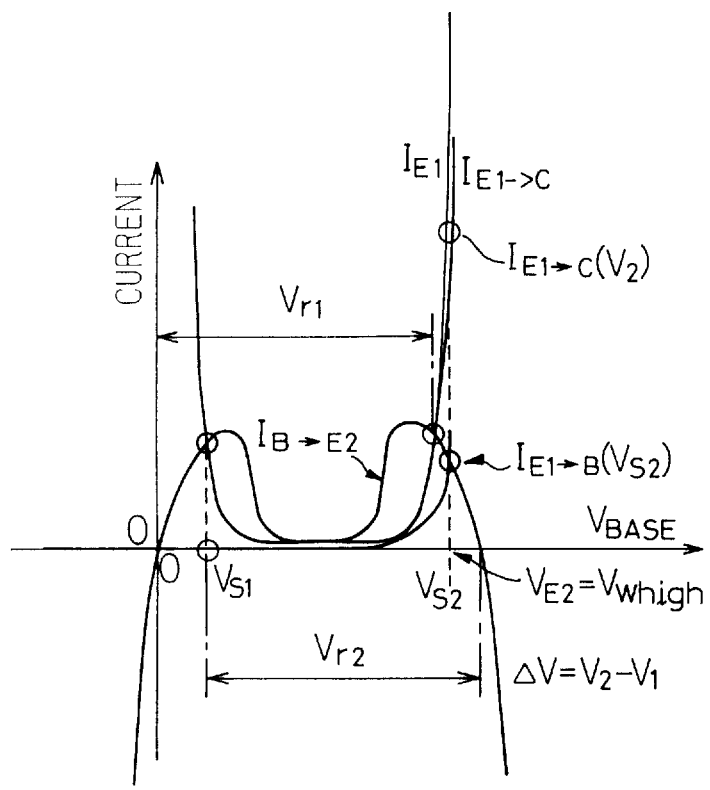

FIGS. 24A and 24B explain a read operation of the memory cell of FIGS. 4A and 4B (second embodiment). FIG. 24A shows simplified characteristics of an Esaki tunnel heterojunction transistor (ME-EHBT), which is used in the following explanations, and FIG. 24B shows a read operation of the memory cell having the characteristics of FIG. 24A. Note that the memory cell MC has the first and second base-emitter junctions D1 and D2, which form, together with the base layer, the series circuits that provide the two stable operation points S1 and S2. Further, in the following explanations, the first emitter E1 is connected to the ground (GND).

As shown in FIG. 24B, when selecting both the bit line BL and word line WL, the operation point S1 having a low base potential provides a low gain, and the operation point S2 having a high base potential provides a high gain. The potential $V_{E2}$=VWhigh applied to the second emitter E2 through the word line WL is higher than the sustain potential but sufficiently low not to destruct data stored in the memory cell. Under this state, a current flowing through the bit line BL is detected to specify one of the operation points S1 and S2, to thereby read the data out of the memory cell.

Figure 25A:
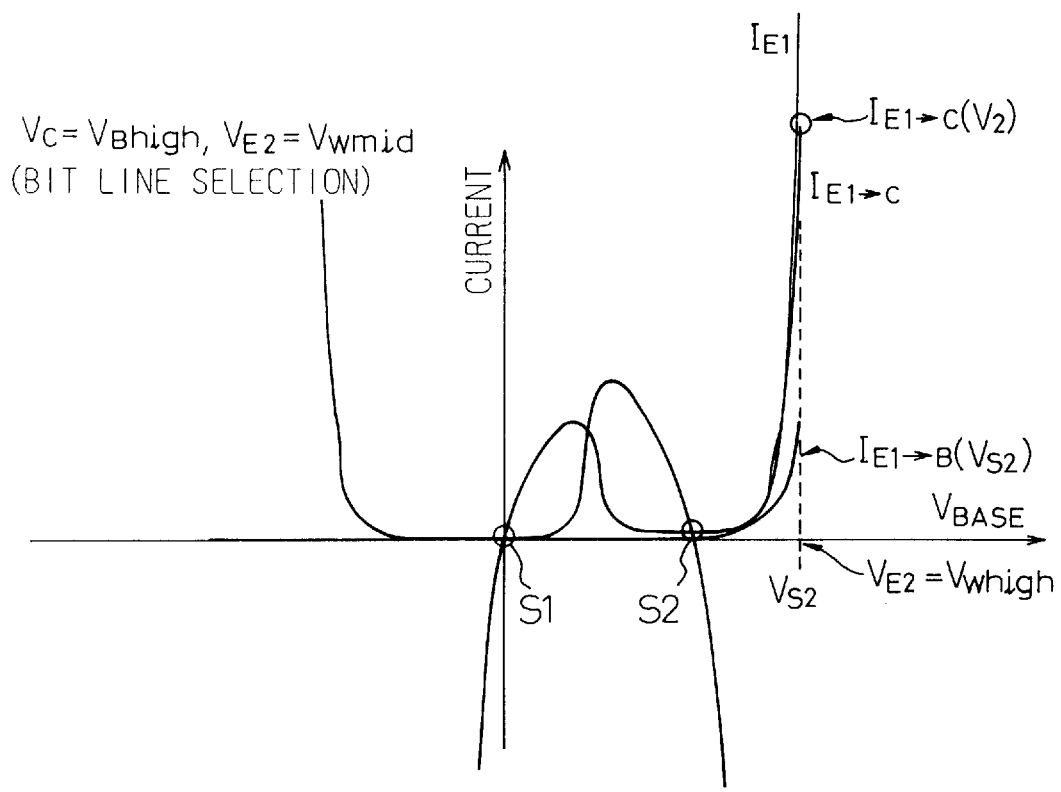
FIGS. 25A to 25C explain the reason for requiring an improvement for the read operation of the memory cell of FIGS. 4A and 4B.
Figure 25B:
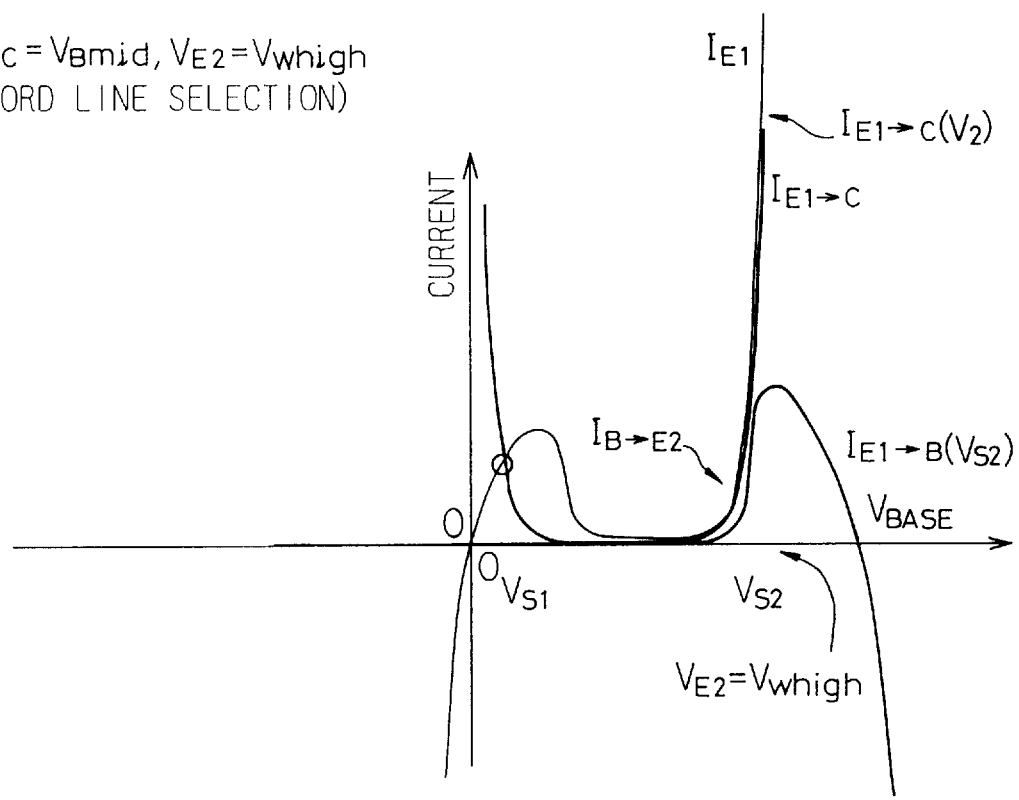
Figure 25C:
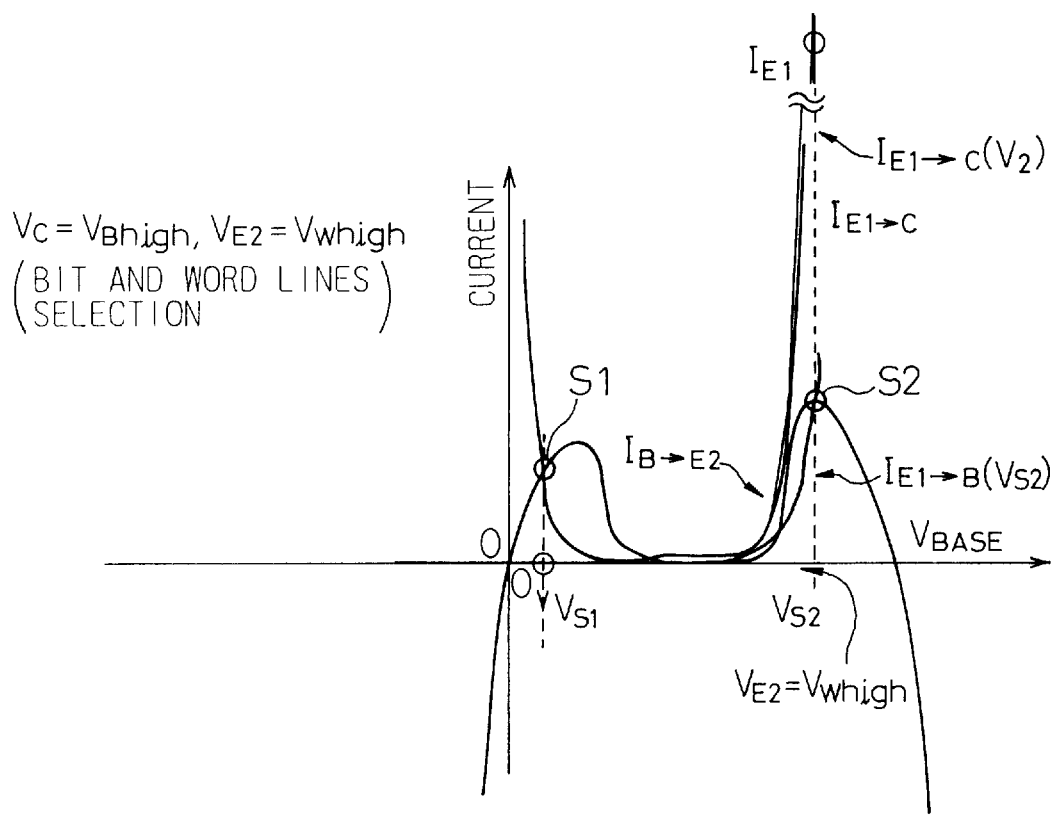

FIGS. 25A to 25C explain the reasons for requiring an improvement for the read operation of the memory cell of FIGS. 4A and 4B.

First, as shown in FIG. 25A, a potential VC=VBhigh is applied to the collector C through the bit line BL so that the transistor (ME-HBT, ME-EHBT) Tr provides a sufficient gain. At this time, the operation point S1 involves a low base potential to provide a low gain, and the operation point S2 involves a high base potential to provide a high gain.

Next, as shown in FIG. 25B, a high potential is applied to the second emitter E2 through the word line WL, in order to increase the difference of the collector currents, the data stored in the memory cell may be destructed. Therefore, in the second embodiment of the present invention, the high potential VWhigh should be determined higher than the sustain potential but sufficiently low not to destruct data stored in the memory cell (with reference to FIG. 14B).

Namely, in the SRAM employing the memory cell having layer structure and energy band characteristics of FIGS. 4A and 4B, the transistor Tr provides a gain after a base-emitter voltage being higher than the valley voltage, and thus when applying a positive voltage to the collector of the transistor during the reading operation, the collector current does not flow in the stable operation point S1 where a low voltage is applied to the resonance barrier close to the emitter, but the collector current flows in the stable operation point S2 where a high voltage is applied to the resonance barrier. In this state, the collector current is detected to specify one of the stable operation points S1 and S2, to thereby read the data (whether the stored data of the transistor is at "0" or "1").

Note that, in order to increase the difference value between the collector currents of the two operation points S1 and S2, current values injected from the emitters are increased by applying a potential higher than the sustain potential to the bit line BL, in practice. However, the difference between the forward and reverse rising voltages after the valley is almost zero, and thus the potential (or bias voltage) applied to the word line WL should be determined the voltage not to destruct data (one state of the stable operation point S1) stored in the transistor (memory cell). Namely, in another state of the stable operation point S2, the bias voltage should be determined under a potential where the emitter current does not exceed the reverse peak current.

Therefore, the bias point is shifted ($\Delta V$) to a high voltage by applying a voltage to the collector of the transistor, and the injection current is increased in accordance with the shifted voltage value ($\Delta V$). Note that the bias point is determined at a point where the base current is equal to the current of the emitter E2. Namely, the shifted voltage value $\Delta V$ is determined by the following equation.

$$\Delta V = Ip2 \times \text{EXP}(\Delta V/nk_B T) \times (1-h_{FE})/h_{FE}$$

Note that the shifted voltage value $\Delta V$ is lower than the peak voltage (for example, the peak voltage of an Esaki tunnel is about 0.1 volts), a value n (constant n of $(\Delta V/nk_B T)$ in the above equation) is about 2, and thus the injection current is improved at most 10 times when assuming the gain of the transistor to be infinity.

FIG. 25C shows the read operation when both the bit line BL and word line WL are selected. Note that the operation point S1 having a low base potential provides a low gain, and the operation point S2 having a high base potential provides a high gain. The potential VE2=VWhigh applied to the second emitter E2 through the word line WL is higher than the sustain potential but sufficiently low not to destruct data stored in the memory cell. In this state, a current flowing through the bit line BL is detected to specify one of the operation points S1 and S2, to thereby read the data out of the memory cell (transistor Tr).

Nevertheless, for example, the read operation is carried out by sufficiently increasing the potentials of the word line WL and the bit line BL, decreasing the potential of the bit line BL, and then decreasing the potential of the word line WL, the data stored in the memory cell may be destructed. Further, as described below, when inappropriately carrying out the sequence of changing the potentials of the word and bit lines at the time of reading operation, a sufficient gain cannot be provided from the memory cell. Below, the above problems will be explained in accordance with equations.

$$I_{E1}(V) \approx I_{P1} \times V/V_{P1} + I_{P1} \times \exp((V - V_{r1})/k_B T) \quad (V < V_{P1})$$

$$I_{E1}(V) \approx I_{P1} \times \exp((V - V_{r1})/k_B T) \quad (V > V_{P1})$$

$$I_{E1 \to B}(V) \approx I_{P1} \times V/V_{P1} + I_{P1} \times \exp((V - V_{r1})/k_B T)/h_{FE} \quad (V < V_{P1})$$

$$I_{E1 \to B}(V) \approx I_{P1} \times \exp((V - V_{r1})/k_B T)/h_{FE} \quad (V < V_{P1})$$

$$I_{E1 \to C}(V) \approx I_{P1} \times \exp((V - V_{r1})/k_B T)(h_{FE} - 1)/h_{FE}$$

$$I_{E2}(V) \approx I_{P2}(V_{E2} - V)/V_{P2} + I_{P2} \times \exp((V_{E2} - V + V_{r2})/k_B T)$$

Assuming that $V_{r1}=V_{r2}=V_r$, $V_{P1}=V_{P2}=V_P$, and $I_{P2}/I_{P1}=e$. In order not to destruct the state S1:

$$V_{S1} < V_{P1}$$

$$\therefore I_{E2}(V_P) < I_{P1},$$

$$\therefore (V_{E2} - V_P - V_r)/k_B T < -1$$

$$\therefore V_{E2} < -k_B T + V_P - V_r$$

Therefore, in the condition for providing the maximum flowing current, assuming that $$V_{E2} = -k_B T + V_P + V_r:$$

The bias point of the state S2 is determined by:

$$I_{E1 \to B}(V_{S2}) = I_{E2}(V_{S2})$$

$$\exp((V_{S2} - V_r)/k_B T)/h_{FE} = e(-k_B T + V_P + V_r - V_{S2})/V_{P2} \quad V_{S2} = V_P + V_r$$

$$(V_{S2} - V_{r1})/k_B T = U \quad \exp(V_P/kbt)$$

$$\exp(U/k_B T)/h_{FE} = e(-k_B T + V_P - U)/V_P$$

$$U_{FE} = \text{Infinity}$$

$$U = -k_B T + V_P$$

when $H_{FE} = e^3 = 20.1$ $$\exp(U/k_B T) = e^4(1 - (k_B T + U)/V_P)$$

$$\therefore U/k_B T = 4 + \ln(1 - (U + K_B T)/V_P)$$

when $H_{FE} = e^2 = 7.4$ $$\exp(U/k_B T) = e^3(1 - (k_B T + U)/V_P)$$

$$\therefore U/k_B T = 3 + \ln(1 - (U + k_B T)/V_P)$$

Assuming that $V_P = 4k_B T = 0.1$ V $$U/k_B T = 3 \tag{A}$$

$$\therefore I_{E1 \to c}(V_{S2}) \approx I_{P1} \times \exp(U/k_B T)$$

$$\therefore I_{E1 \to c}(V_{S2}) \approx e^3 I_{P1} \approx 20.1 I_{P1}$$

$$\therefore I_{E1 \to c}(V_{S2}) \approx e^2 I_{P2} \approx 7.4 I_{P2}$$

$$U/k_B T = 4 + \ln(3/4 - U/4k_B T) \tag{B}$$

$$\therefore U/k_B T \approx 2.38$$

$$\therefore I_{E1}(V_{S2}) \approx I_{P1} \times \exp(U/k_B T) \approx 10.8 I_{P1}$$

$$\therefore I_{E1 \to c}(V_{S2}) \approx 10.3 I_{P1}$$

$$\therefore I_{E1 \to c}(V_{S2}) \approx 3.8 I_{P2}$$

-continued $$U/k_B T = 3 + \ln(3/4 - U/4k_B T) \tag{C}$$

$$\therefore U/k_B T \approx 1.80$$

$$\therefore I_{E1}(V_{S2}) \approx I_{P1} \times \exp(U/k_B T) \approx 6.0 I_{P1}$$

$$\therefore I_{E1 \to c}(V_{S2}) \approx 5.2 I_{P1}$$

$$\therefore I_{E1 \to c}(V_{S2}) \approx 1.9 I_{P2}$$

Namely, for example, in the reading operation of the memory cell having layer structure of FIG. 4A and energy band characteristics of FIG. 4B, $I_{E1 \to c}(V_{S2})$ is determined as follows:

when $U/(k_B T)=3$ $$I_{E1 \to c}(V_{S2}) = e^2 \times I_{P2} = 7.4 \times I_{P2} \tag{A}$$

when $U/(k_B T)=4+\ln(3/4-U/(4k_B T))$ $$I_{E1 \to c}(V_{S2}) = 3.8 \times I_{P2} \tag{B}$$

when $U/(k_B T)=3+\ln(3/4-U/(4k_B T))$ $$I_{E1 \to c}(V_{S2}) = 1.9 \times I_{P2} \tag{C}$$

Therefore, in the third embodiment of the present invention, the emitter layer (second emitter layer) of the transistor Tr is made of $p^{++}$-InAlAs, so that a voltage Vr2 rising after a reverse valley of the second emitter E2 is determined to be higher than a voltage Vr1 rising after a forward valley of the first emitter E1. Namely, in order to satisfy the condition "Vr1<Vr2", the transistor Tr (the memory cell (MC) is constituted such that a band gap of the second emitter layer (E2) is larger than a band gap of a base layer). Note that a resonance level construction layer is inserted between the first emitter layer and the second emitter layer in order to increase a peak/valley ratio (P/V ratio). Namely, the resonance level construction layer of a large band gap semiconductor layer is inserted between the first emitter layer and the second emitter layer, so that a peak current density is maintained at high by using a resonance tunneling effect of the resonance level construction layer.

The layer structure of the transistor Tr, i.e., ME-HBT is as mentioned below. The structure employs an Fe-doped InP semiconductor substrate.

| | | Dope Concentration | Thickness (nm) |
|---|---|---|---|
| 1) Buffer | i-InAlAs | | 200 |
| 2) Subcollector | $n^{++}$-InGaAs | $5 \times 10^{18}$ | 350 |
| 3) Collector | n-InGaAs | $5 \times 10^{16}$ | 300 |
| 4) Base | $p^{++}$-InGaAs | $3 \times 10^{19}$ | 80 |
| 5) First Emitter | $n^{++}$-InAlAs | $3 \times 10^{18}$ | 100 |
| 6) Resonance | i-InGaAs | | 4 |
| Level | i-InAlAs | | 2 |
| Construction | i-InGaAs | | 4 |
| 7) Second Emitter | $p^{++}$-InAlAs | $3 \times 10^{19}$ | 100 |
| 8) Emitter Contact | $n^{++}$-InGaAs | $3 \times 10^{19}$ | 100 |

Figure 26B:
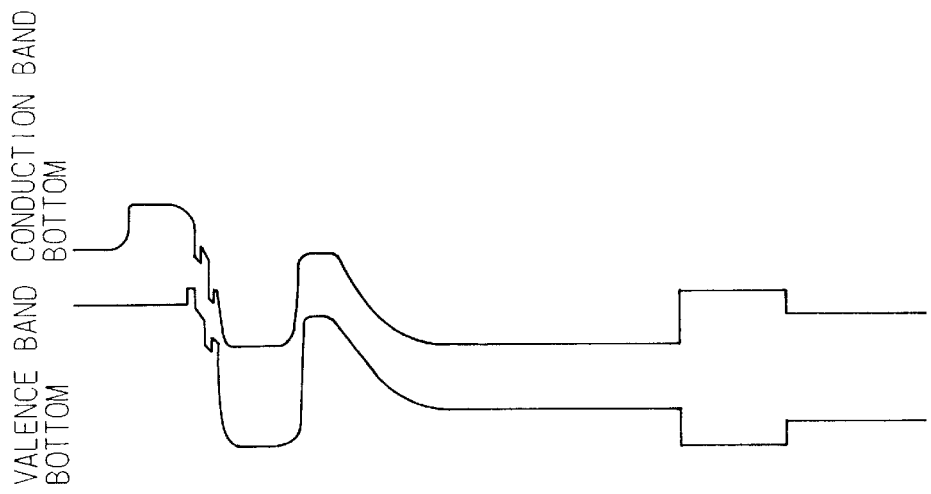
FIG. 26B shows the energy band of the structure of FIG. 26A.
Figure 26A:
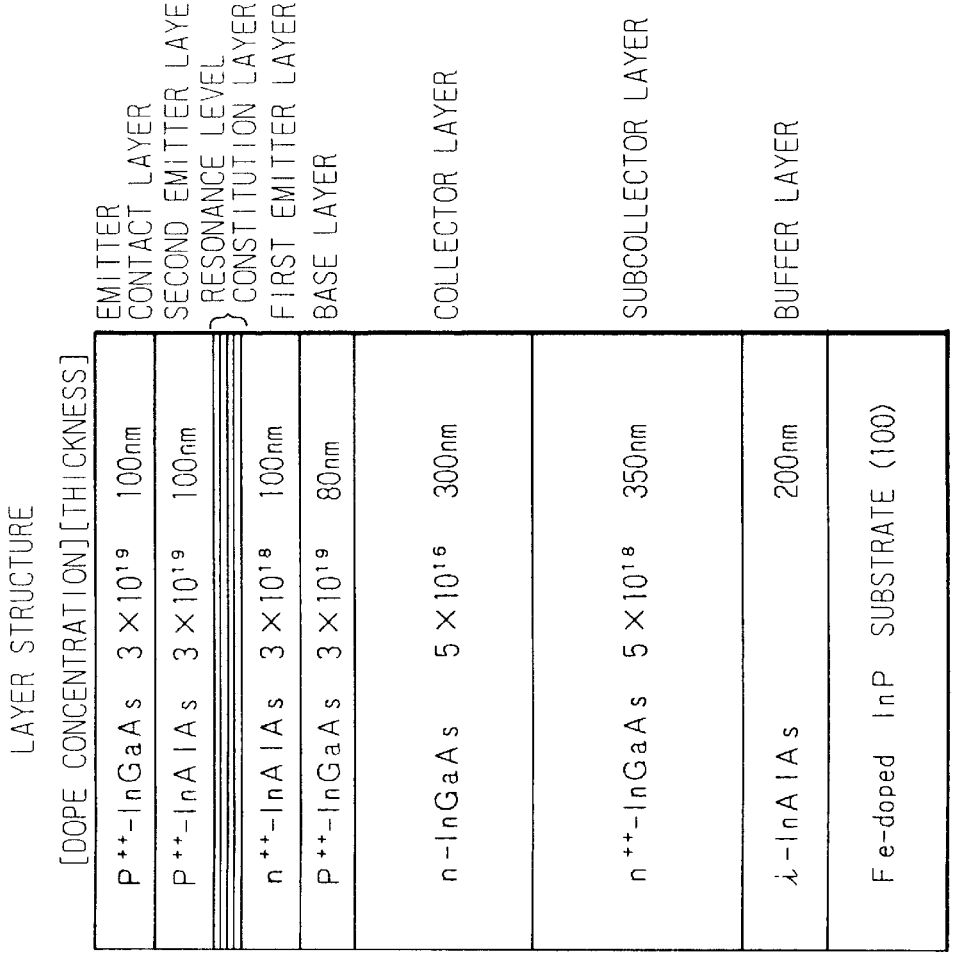
FIG. 26A shows the layer structure of a memory cell of a semiconductor memory according to a third embodiment of the present invention.

FIG. 26A shows the layer structure of a memory cell of a semiconductor memory according to a third embodiment of the present invention, and FIG. 26B shows the energy band of the structure of FIG. 26A. The memory cell shown in FIGS. 26A and 26B is made of an ME-RBT (multiemitter heterojunction bipolar transistor) such as an ME-EHBT (multiemitter Esaki tunnel heterojunction bipolar transistor).

As shown in FIGS. 26A and 26B, in the transistor (memory cell) of the third embodiment, the buffer, subcollector, collector, base, first emitter, resonance level construction, second emitter, and emitter contact layers are sequentially laminated on the Fe-doped InP substrate (100).

By comparing the third embodiment of the memory cell of FIGS. 26A and 26B with the second embodiment of the memory cell of FIGS. 4A and 4B, in the third embodiment, the first and second emitter layers are made of InAlAs, and the resonance level construction layer is inserted between the first and second emitter layers. Namely, the first emitter layer is formed on the base layer, and the dope concentration of the $n^{++}$-InAlAs layer of 100 nm thick of the first emitter layer is $3 \times 10^{18}$. Further the resonance level construction layer having an i-InGaAs layer of 4 nm thick, an i-InAlAs layer of 2 nm thick, and an i-InGaAs layer of 4 nm thick is formed on the first emitter layer, and the second emitter layer is formed on the resonance level construction layer. The doping concentration of the $p^{++}$-InAlAs layer of 100 nm thick of the second emitter layer is $3 \times 10^{19}$.

Namely, the memory cell of the third embodiment is constituted as a multiemitter Esaki tunnel heterojunction bipolar transistor where the first emitter layer has a first conduction type and has high-concentration-doped ($n^{++}$-InAlAs $3 \times 10^{18}$), the second emitter layer has a second conduction type opposite to the first conduction type and has high-concentration-doped ($p^{++}$-InAlAs $3 \times 10^{19}$), and the second emitter layer is formed on the first emitter layer through the resonance level construction layer (i-InGaAs, i-InAlAs, i-InGaAs).

FIG. 27 shows junction characteristics of the memory cell of FIGS. 26A and 26B. In FIG. 27, reference Vr1 denotes junction characteristics of $n^{++}$-InAlAs/$^{++}$-InGaAs (first emitter layer/base layer), and Vr2 denotes junction characteristics of $n^{++}$-InAlAs/iInGaAs/i-InAlAs/i-InGaAs/$p^{++}$-InAlAs (first emitter layer/resonance level construction layer/second emitter layer).

As shown in FIG. 27, the memory cell (transistor) of the third embodiment has an N-shaped negative differential current-voltage characteristic where a voltage Vr2 rising after a reverse valley of the second emitter E2 is higher than a voltage Vr1 rising after a forward valley of the first emitter E1.

Figure 28A:
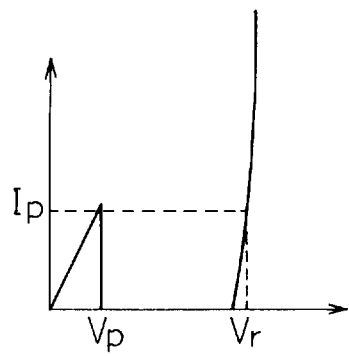
FIGS. 28A and 28B explain a read operation (without determining control sequence of bit and word lines) of the memory cell of FIGS. 26A and 26B.
Figure 28B:
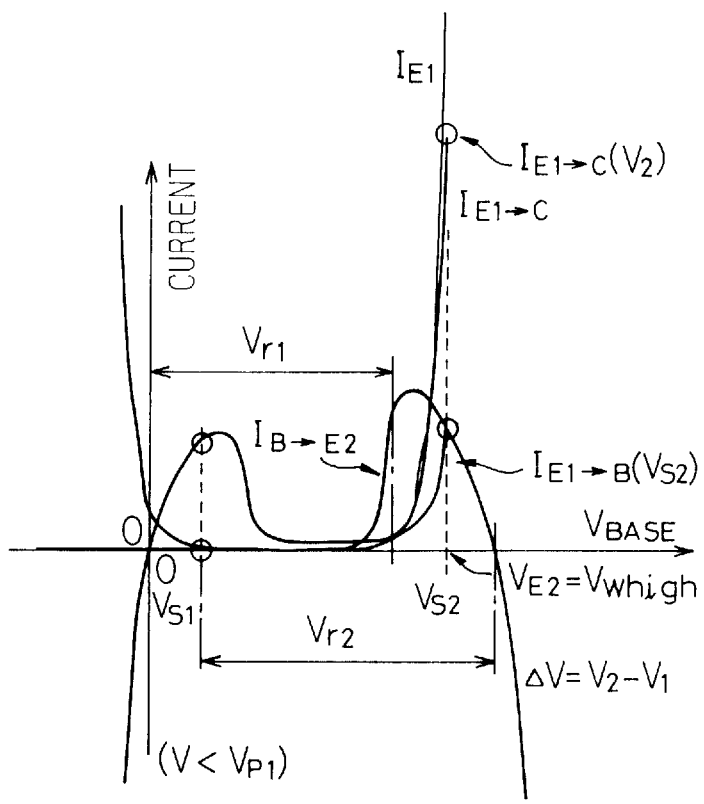

FIGS. 28A and 28B explain a read operation (without determining control sequence of bit and word lines) of the memory cell of FIGS. 26A and 26B. FIG. 28A shows simplified characteristics of a multiemitter Esaki tunnel heterojunction transistor (ME-EHBT), which is used in the following explanations, and FIG. 28B shows a read operation of the memory cell having the characteristics of FIG. 28A. Note that the memory cell MC has the first and second base-emitter junctions D1 and D2, which form, together with the base layer, the series circuits that provide the two stable operation points S1 and S2.

Further, in the following explanations, the first emitter E1 is connected to the ground (GND).

As shown in FIG. 28B, in the read operation of the memory cell according to the third embodiment of the present invention, the ME-EHBT has an N-shaped negative differential current-voltage characteristic where a voltage Vr2 rising after a reverse valley of the second emitter E2 is higher than a voltage Vr1 rising after a forward valley of the first emitter E1 (Vr1<Vr2). Therefore, when applying a positive potential to the bit line BL and applying a high potential to the word line WL in order to read the data stored in the memory cell, the current after the reverse valley does not rise in the stable operation point S1 regardless the gain value of the stable operation point S2.

Namely, the state of applying the positive potential to the bit line BL and applying the high potential to the word line WL for carrying out the read operation is stated in a valley area, and thus the state of the operation point S1 is not destructed, so that the voltage applying to the word line WL can be determined without considering the destruction of the state of the operation point S1. Therefore, in the operation point S2, the voltage of the word line W1 can be made to high enough without the base current exceeding the reverse peak current. In this state, the current flow is determined by the equation: $I_{P2} \times h_{FE}$, where $I_{P2}$ is a reverse peak current, and $h_{FE}$ is a current gain at the bias point. Namely, the current flow can be increased in accordance with the current gain.

Note that, in the characteristics of Esaki tunnel diode, the voltage where the current rises after the valley is determined in accordance with the band gap of p-type semiconductor layer, and thus the band gap of the second emitter layer of the transistor Tr is made larger than the band gap of the base layer thereof. Further, the materials having a large band gap value are generally difficult to cause the tunneling effect, since the electrons of the materials have large effective mass, and the value of the peak current density becomes small.

In a paper No. LD-12 of the Solid State Component Conference in 1992, there is proposed the concept of resonance inter-band-tunneling, and this resonance inter-band-tunneling can be employed in the memory cell (transistor) of the third embodiment. Note that, the transistor (memory cell) having the construction for the resonance inter-band-tunneling does not have only the effect for increasing the peak current density of Esaki tunnel effect in the PN-junction, but also has a highest known P/V ratio of the negative differential current-voltage characteristic.

Next, the operation of the memory cell of SRAM using the transistor having the layer structure of FIGS. 26A and 26B will be explained with reference to equations.

$$I_{E1}(V) \approx I_{P1} \times V/V_{P1} + I_{P1} \times \exp((V - V_{r1})/k_BT) \quad (V < V_{P1})$$

$$I_{E1}(V) \approx I_{P1} \times \exp((V - V_{r1})/k_BT) \quad (V > V_{P1})$$

$$I_{E1 \to B}(V) \approx I_{P1} \times V/V_{P1} + I_{P1} \times \exp((V - V_{r1})/k_BT)/h_{FE} \quad (V < V_{P1})$$

$$I_{E1 \to B}(V) \approx I_{P1} \times \exp((V - V_{r1})/k_BT)/h_{FE} \quad (V < V_{P1})$$

$$I_{E1 \to C}(V) \approx I_{P1} \times \exp((V - V_{r1})/k_BT)(h_{FE} - 1)/h_{FE}$$

$$I_{E2}(V) \approx I_{P2}(V_{E2} - V)/V_{P2} + I_{P2} \times \exp((V_{E2} - V + V_{r2})/k_BT)$$

Assuming that $V_{P1} = V_{P2} = V_P$, and $I_{P2}/I_{P1} = e$.

Note that the state S1 is always maintained under the condition of not destruct the state S2. Therefore, the condition not for destructing the state S2 is only considered.

$$I_{E1}(V_{E2} - V_P) = I_{P1} \times \exp((V_{E2} - V_P - V_{r1})/k_BT) < I_{P2}$$

Therefore, in the condition for providing the maximum flowing current, assuming that $V_{E2} = V_P + V_{r1}$:

The bias point of the state S2 is determined by:

$$I_{E1 \to B}(V_{S2}) = I_{E2}(V_{S2})$$

$$\exp((V_{S2} - V_r)/k_BT)/h_{FE} = e(V_P + V_r - V_{S2})/V_P$$

$$(V_{S2} - V_{r1})/k_BT = U$$

$$\exp(U/k_BT)/h_{FE} = e(V_P - U)/V_P$$

$$H_{FE} = \text{Infinity}$$

$$U = V_P$$

when $H_{FE} = e^2 = 7.4$ $$\exp(U/k_BT) = e^4(1 - U/V_P)$$

$$\therefore U/k_BT = 4 + \ln(1 - U/V_P)$$

when $H_{FE} = e^3 = 20.1$ $$\exp(U/k_BT) = e^4(1 - U/V_P)$$

$$\therefore U/k_BT = 4 + \ln(1 - U/V_P)$$

Assuming that $V_P = 4k_B T = 0.1$ V $$U/k_B T = 4 \tag{A'}$$

$$\therefore I_{E1 \to c}(V_{S2}) \approx I_{P1} \times \exp(U/k_B T)$$

$$\therefore I_{E1 \to c}(V_{S2}) \approx e^4 I_{P1} \approx 54.6 I_{P1}$$

$$\therefore I_{E1 \to c}(V_{S2}) \approx e^3 I_{P2} \approx 20.0 I_{P2}$$

$$U/k_B T = 4 + \ln(1 - U/4k_B T) \tag{B'}$$

$$\therefore U/k_B T \approx 2.80$$

$$\therefore I_{E1}(V_{S2}) \approx I_{P1} \times \exp(U/k_B T) \approx 16.4 I_{P1}$$

$$\therefore I_{E1 \to c}(V_{S2}) \approx 15.6 I_{P1}$$

$$\therefore I_{E1 \to c}(V_{S2}) \approx 5.7 I_{P2}$$

$$U/k_B T = 3 + \ln(1 - U/4k_B T) \tag{C'}$$

$$\therefore U/k_B T \approx 2.20$$

$$\therefore I_{E1}(V_{S2}) \approx I_{P1} \times \exp(U/k_B T) \approx 9.0 I_{P1}$$

$$\therefore I_{E1 \to c}(V_{S2}) \approx 7.8 I_{P1}$$

$$\therefore I_{E1 \to c}(V_{S2}) \approx 2.9 I_{P2}$$

Namely, for example, in the reading operation of the memory cell having layer structure of FIG. 26A and energy band characteristics of FIG. 26B, $I_{E1 \to c}(V_{S2})$ is determined as follows:

when $U/(k_B T) = 4$ $$I_{E1 \to c}(V_{S2}) = e^2 \times I_{P2} = 20.0 \times I_{P2} \tag{A'}$$

when $U/(k_B T) = 4 + \ln(1 - U/(4k_B T))$ $$I_{E1 \to c}(V_{S2}) = 5.7 \times I_{P2} \tag{B'}$$

when $U/(k_B T) = 3 + \ln(1 - U/(4k_B T))$ $$I_{E1 \to c}(V_{S2}) = 2.9 \times I_{P2} \tag{C'}$$

Therefore, by comparing the equations (A) to (C) of the memory of FIGS. 4A and 4B with the equations (A') to (C') of the memory (third embodiment) of FIGS. 26A and 26B, in the third embodiment, the gain of the memory cell can be largely increased. For example, when $U/(k_B T) = 4$ [or $U/(k_B T) = 3$], $7.4 \times I_{P2}$ (A) can be increased to $20.0 \times I_{P2}$ (A'), that is, increased about 2.7 times.

Figure 29:
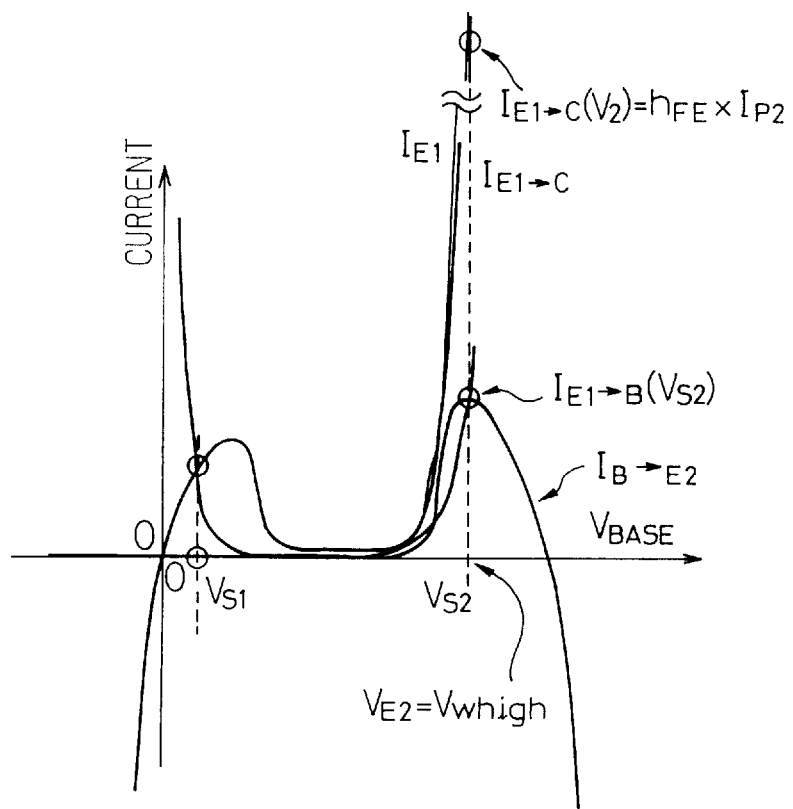
FIG. 29 explains a read operation (with determining control sequence of bit and word lines) of the memory cell of FIGS. 26A and 26B.

FIG. 29 explains a read operation (with determining control sequence of bit and word lines) of the memory cell of FIGS. 26A and 26B.

As shown in FIG. 29, in the reading operation of the memory cell (MC) of the third embodiment, first, a high voltage VBhigh for providing a sufficient gain from the transistor is applied to the bit line BL, and then a voltage VBhigh higher than the sustain voltage is applied to the word line WL to read data stored in the memory cell. Further, after completing the read operation (after reading the data stored in the memory cell), the potential of the word line WL is decreased, and then the potential of the bit line BL is decreased. Therefore, the data stored in the memory cell can be read with sufficient gain and without destructing the stored data. Note that the collector current can be the current gain times the current $I_{P2}$, in principle.

As explained above, the present invention provides a semiconductor memory having memory cells each involving a small number of elements and a small area, as well as a method of sustaining, reading, and writing data in, from, and into the semiconductor memory. The present invention also provides a semiconductor memory having memory cells each operating at a room temperature and involving a small number of elements and a small area, as well as a method of sustaining, reading, and writing data in, from, and into the semiconductor memory.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor memory having a bit line, a word line, a ground line, and a memory cell, the bit line intersecting the word and ground lines to form an intersection where the memory cell is arranged, the memory cell comprising:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line, wherein the transistor is a multiemitter Esaki tunnel heterojunction transistor made of a high-concentration-dope heterojunction bipolar transistor and a second emitter layer formed on a first emitter layer of the bipolar transistor, the second emitter layer having a different conduction type from the first emitter layer and being doped at high concentration.

2. A semiconductor memory as claimed in claim 1, wherein the first emitter layer is made of n-type InAlAs, and the second emitter layer is made of p-type InGaAs.

3. A semiconductor memory having a bit line, a word line, a ground line, and a memory cell, the bit line intersecting the word and ground lines to form an intersection where the memory cell is arranged, the memory cell comprising:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line, wherein the negative differential characteristics of the transistor are designed such that a forward peak current of the first emitter is smaller than a reverse peak current of the second emitter.

4. A semiconductor memory as claimed in claim 3, wherein the area of the emitter-base junction of the first emitter is smaller than the area of the emitter-base junction of the second emitter.

5. A semiconductor memory as claimed in claim 3, wherein each of the first and second emitters has first and second emitter layers, and the doped concentration of the second emitter layer is high when the second emitter layer is of a p-type and is low when the same is of an n-type.

6. A semiconductor memory as claimed in claim 3, wherein the memory cell is arranged between the intersections of the bit line, word line, and ground line with the word and ground lines being in parallel with each other and orthogonal to the bit line.

7. A semiconductor memory as claimed in claim 4, wherein the semiconductor memory has bit lines, word lines, ground lines, and memory cells, the bit lines intersecting the word and ground lines to form intersections where the memory cells are arranged, wherein the semiconductor memory further comprises:

a bit line address decoder for supplying an address signal to the bit lines;

a word line address decoder for supplying an address signal to the word lines; and a sense circuit for detecting data stored in the memory cells through the bit lines.

8. A semiconductor memory as claimed in claim 7, wherein the word lines and ground lines are alternated one by one.

9. A semiconductor memory as claimed in claim 7, wherein the word lines and ground lines are alternated two by two.

10. A semiconductor memory as claimed in claim 9, wherein every two adjacent ground lines are integrated into one.

11. A semiconductor memory having a bit line, a word line, a ground line, and a memory cell, the bit line intersecting the word and ground lines to form an intersection where the memory cell is arranged, the memory cell comprising:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line, wherein the transistor has an N-shaped negative differential current-voltage characteristic where a voltage rising after a reverse valley of the second emitter is higher than a voltage rising after a forward valley of the first emitter.

12. A semiconductor memory as claimed in claim 11, wherein each of the first and second emitters has first and second emitter layers, and the transistor is constituted such that the band gap of the second emitter layer is larger than the band gap of a base layer.

13. A semiconductor memory as claimed in claim 11, wherein each of the first and second emitters has first and second emitter layers, and the transistor is constituted such that a resonance level construction layer is inserted between the first emitter layer and the second emitter layer, so that a peak current density is maintained high by using a resonance tunneling effect of the resonance level construction layer.

14. A semiconductor memory as claimed in claim 13, wherein the resonance level construction layer is made of non-doped InGaAs/InAlAs/InGaAs, the first emitter layer is made of n-type InAlAs, the second emitter layer is made of p-type InAlAs, and a base layer formed under the first emitter layer is made of p-type InGaAs.

15. A method of sustaining data of a memory cell of a semiconductor memory of, the semiconductor memory having a bit line, a word line, a ground line, and a memory cell, the bit line intersecting the word and ground lines, to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current; and the first emitter being connected to the ground line, the second emitter being connected to the word line, and the collector being connected to the bit line, the memory cell having the first and second base-emitter junctions that form, with the base layer, the series circuits to provide the two stable operation points, the method comprising the steps of:

applying a potential, which biases the transistor to the valleys of the N-shaped negative differential characteristics, to the second emitter; and applying a potential to the bit line, the potential being sufficiently low not to provide a gain with respect to a ground level and higher than a reverse breakdown voltage of the base-collector junction of the transistor, wherein the potential applied to the bit line is at a ground level.

16. A method of sustaining data of a memory cell of a semiconductor memory, the semiconductor memory having a bit line, a word line, a ground line, and a memory cell, the bit line intersecting the word and ground lines to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points, wherein the method comprises the steps of:

applying a potential, which biases the transistor to the valleys of the N-shaped negative differential characteristics, to the second emitter; and applying a potential to the bit line, the potential being sufficiently low not to provide a gain with respect to a ground level and higher than a reverse breakdown voltage of the base-collector junction of the transistor.

17. A method as claimed in claim 16, wherein the potential applied to the bit line is at a ground level.

18. A method as claimed in claim 17, wherein a number of memory cells connected to a given word line is smaller than a number of bits of data which is written, data stored in memory cells to which no data is written is once read thereby forming read data, and wherein the read data is again written to the memory cells.

19. A method of reading data out of a memory cell of a semiconductor memory, the semiconductor memory having a bit line, a word line, a ground line, and a memory cell, the bit line intersecting the word and ground lines, to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points, the method comprising the steps of:

applying a potential to the bit line so that the transistor of the memory cell provides a sufficient gain, the first stable operation point involving a low base potential provides a low gain and the second stable operation point involving a high base potential provides a high gain; and applying a potential to the word line, the potential being higher than a sustain potential and sufficiently low not to destruct the data stored in the memory cell, and detecting a current passing through the bit line to read the data.

20. A method as claimed in claim 19, wherein a potential of the bit line is increased to a first voltage in order to obtain a sufficient gain from the transistor, and then a potential of the word line is increased to a second voltage higher than the sustain voltage when starting the reading operation of the memory cell, and the potential of the word line is decreased, and then the potential of the bit line is decreased when completing the reading operation of the memory cell.

21. A method of writing data to a memory cell of a semiconductor memory, the semiconductor memory having a bit line, a word line, a ground line, and a memory cell, the bit line intersecting the word and ground lines to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, the method comprising the steps of:

applying a potential, which is lower than a sustain potential, to the bit line of the memory cell, applying a high potential to the word line, to destruct the two stable operation points, and again applying the sustain potential to the word line, to thereby write data at a first stable operation point involving the low base potential of the two stable operation points of the memory cell when the data must be written to the first operation point; and maintaining the sustain potential to the bit line of the memory cell, applying a low potential to the word line, to destruct the two stable operation points, and again applying the sustain potential to the word line, to thereby write data at a second stable operation point involving the high base potential of the two stable operation points of the memory cell when the data must be written to the second operation point.

22. A method as claimed in claim 21, wherein a number of memory cells connected to a given word line is smaller than a number of bits of data which is written, data stored in memory cells to which no data is written is once read thereby forming read data, and wherein the read data is again written to the memory cells.

23. A method of writing data to an array of memory cells of a semiconductor memory, the semiconductor memory having a bit line, a word line, a ground line, and a memory cell, the bit line intersecting the word and ground lines to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, each memory cell having the first and second base-emitter junctions that form, with the base layer, the series circuits to provide the two stable operation points involving low and high base potentials, respectively, the method comprising the steps of:

maintaining a sustain potential to the bit line, applying a low potential to a given word line to destruct the two stable operation points of all memory cells connected to the given word line, applying again the sustain potential to the given word line, to thereby write data at a second stable operation point involving the high base potential of the two stable operation points of all memory cells connected to the given word line;

applying a potential, which is lower than the sustain potential, only to bit lines connected to memory cells to be inversely written at a first operation point involving the low base potential of the two stable operation points, in the all memory cells at the second stable operation points; and applying a potential to the given word line to destruct the two stable operation points and applying the sustain potential to the given word line, to write the data corresponding to both first and second stable operation points to the memory cells.

24. A method as claimed in claim 23, wherein a number of memory cells connected to a given word line is smaller than a number of bits of data which is written, data stored in memory cells to which no data is written is once read thereby forming read data, and wherein the read data is again written to the memory cells.

25. A method of writing data to a memory cell of a semiconductor memory, the semiconductor memory having a bit line, a word line, a ground line, and a memory cell, the bit line intersecting the word and ground lines, to form an intersection where the memory cell is arranged, and the memory cell comprises:

a double-emitter transistor having a collector, a first emitter, and a second emitter, each emitter-base junction of the transistor having an N-shaped negative differential current-voltage characteristic that shows a relatively small gain up to a peak current and a relatively large gain after a valley current, and the negative differential characteristics of the transistor being designed such that a forward peak current of the first emitter is smaller than a reverse peak current of the second emitter; and the first emitter being connected to the ground line, the second emitter being connected to the word line, and the collector being connected to the bit line, the memory cell having the first and second base-emitter junctions that form, with the base layer, the series circuits to provide the two stable operation points involving low and high base potentials, respectively, the method comprising the steps of:

applying a potential, which is lower than a sustain potential, to the bit line corresponding to memory cells to be written at a first stable operation point involving the low base potential of the two stable operation points;

applying a sustain potential to the bit line corresponding to memory cells to be written at a second stable operation point involving the high base potential of the two stable operation points; and applying a potential, which is sufficiently low to destruct the two stable operation points, to the word line, and again applying the sustain potential to the word line, to thereby simultaneously write the data corresponding to both first and second stable operation points to the memory cells.

26. A method as claimed in claim 25, wherein a number of memory cells connected to a given word line is smaller than a number of bits of data which is written, data stored in memory cells to which no data is written is once read thereby forming read data, and wherein the read data is again written to the memory cells.

* * * * *